US 12,322,708 B2

(12) United States Patent
Mariko et al.

(10) Patent No.: US 12,322,708 B2
(45) Date of Patent: Jun. 3, 2025

(54) SEMICONDUCTOR DEVICE

(71) Applicant: RENESAS ELECTRONICS CORPORATION, Tokyo (JP)

(72) Inventors: Takehirou Mariko, Tokyo (JP); Yasuhiro Okamoto, Tokyo (JP); Senichirou Nagase, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 448 days.

(21) Appl. No.: 17/828,376

(22) Filed: May 31, 2022

(65) Prior Publication Data

US 2023/0027022 A1  Jan. 26, 2023

(30) Foreign Application Priority Data

Jul. 19, 2021  (JP) ................. 2021-118820

(51) Int. Cl.
| | | |
|---|---|---|
| *H01L 29/78* | (2006.01) | |
| *H01L 21/304* | (2006.01) | |
| *H01L 21/66* | (2006.01) | |
| *H01L 21/78* | (2006.01) | |
| *H01L 23/544* | (2006.01) | |
| *H01L 29/06* | (2006.01) | |

(52) U.S. Cl.
CPC .......... *H01L 23/544* (2013.01); *H01L 21/304* (2013.01); *H01L 21/78* (2013.01); *H01L 22/14* (2013.01); *H01L 29/0634* (2013.01); *H01L 29/7813* (2013.01); *H01L 2223/5446* (2013.01)

(58) Field of Classification Search
CPC ..... H01L 23/544; H01L 21/304; H01L 21/78; H01L 22/14; H01L 29/0634; H01L 29/7813; H01L 2223/5446

USPC ........................................................ 257/330
See application file for complete search history.

(56) References Cited

U.S. PATENT DOCUMENTS

| | | | |
|---|---|---|---|
| 9,209,249 B2 | 12/2015 | Kachi | |
| 10,615,251 B2 | 4/2020 | Yoshida et al. | |
| 2002/0185667 A1* | 12/2002 | Asano | ................ H01L 27/0605 257/283 |
| 2018/0145007 A1* | 5/2018 | Hatano | ................ H01L 25/115 |
| 2019/0131448 A1* | 5/2019 | Yoshida | ............. H01L 29/0882 |

FOREIGN PATENT DOCUMENTS

| | | |
|---|---|---|
| JP | 2006-203151 A | 8/2006 |
| JP | 2007-251023 A | 9/2007 |
| JP | 2009-231586 A | 10/2009 |
| JP | 2014-154596 A | 8/2014 |
| JP | 2019-033148 A | 2/2019 |

OTHER PUBLICATIONS

Office Action dated Oct. 8, 2024, from corresponding Japanese Application No. 2021-118820, 4 pages.

* cited by examiner

*Primary Examiner* — Phuc T Dang
(74) *Attorney, Agent, or Firm* — Rimon P.C.

(57) ABSTRACT

In a semiconductor device in a wafer state, an element region and a scribe region are defined in one main surface of a semiconductor substrate. In the element region, a vertical MOS transistor is formed as a semiconductor element. In the scribe region, an n-type column region and a p-type column region are defined. An n-type column resistor is formed in the n-type column region. A p-type column resistor is formed in the p-type column region.

4 Claims, 22 Drawing Sheets

Dose amount of p-type impurity

Resistance value of n-type column resistor
/Resistance value of p-type column resistor

SEMICONDUCTOR DEVICE

CROSS-REFERENCE TO RELATED APPLICATIONS

The disclosure of Japanese Patent Application No. 2021-118820 filed on Jul. 19, 2021 including the specification, drawings and abstract is incorporated herein by reference in its entirety.

BACKGROUND

The present invention relates to a semiconductor device and a method of manufacturing the same, and can be favorably used for, for example, a semiconductor device having a super junction structure.

For example, in a power semiconductor device including a semiconductor element such as a vertical MOS (Metal Oxide Semiconductor) transistor, a super junction structure in which pn junctions are periodically arranged has been known. In the super junction structure, the pn junctions are periodically arranged by p-type column layers and n-type column layers.

In the semiconductor device having the super junction structure, the withstand voltage (junction withstand voltage) of the semiconductor device is ensured by periodically arranging the pn junctions. Conventionally, the withstand voltage of the semiconductor device has been estimated based on a dose amount ratio of the dose amount of a p-type impurity at the time of forming a p-type column layer and the dose amount of an n-type impurity at the time of forming an n-type column layer. As examples of the patent document disclosing a power semiconductor device having such a super junction structure, Patent Document 1 and Patent Document 2 can be presented.

THERE ARE DISCLOSED TECHNIQUES LISTED BELOW

[Patent Document 1] Japanese Unexamined Patent Application Publication No. 2019-33148
[Patent Document 2] Japanese Unexamined Patent Application Publication No. 2014-154596

SUMMARY

The n-type column layer and the p-type column layer in the semiconductor device are formed in a self-alignment manner in a semiconductor substrate by implanting an n-type impurity and a p-type impurity via a relatively deep trench formed in the semiconductor substrate. Therefore, the distribution of the impurities may vary depending on the shape of the deep trench. If the distribution of impurities varies, the withstand voltage of the actual semiconductor device also varies.

In the method of estimating the withstand voltage from the dose amount ratio, the withstand voltage will be estimated uniquely even if the distribution of impurities varies. In the case of a semiconductor device having a relatively low withstand voltage as a power semiconductor device, even if the withstand voltage varies due to the variation in the distribution of impurities, the effect is small. Therefore, for the semiconductor devices having low withstand voltage, a method of estimating the withstand voltage from the dose amount ratio has been considered effective.

In the future, as this type of semiconductor device, a semiconductor device having a medium withstand voltage or higher (for example, 80 V or higher) will be required. In the case of the semiconductor device that is required to have the medium withstand voltage or higher, if the withstand voltage varies due to variations in the distribution of impurities, the variation in withstand voltage cannot be ignored.

Therefore, for the semiconductor device that is required to have the medium withstand voltage or higher, a new method for estimating the withstand voltage is necessary. Namely, there is a need for a new method that replaces the method of estimating the withstand voltage from the dose amount ratio that does not reflect variations in the distribution of impurities.

The inventors have considered a method of measuring the withstand voltage of a completed semiconductor device (semiconductor element) as a new method. With this method, it becomes possible to measure the withstand voltage of the semiconductor device more accurately. However, when measuring the withstand voltage of the semiconductor device by this method, it is necessary to polish the back surface of the semiconductor substrate to form a back surface electrode after the wafer process is completed.

Therefore, it takes time (days) from the completion of the wafer process to the measurement of the withstand voltage of the semiconductor device. Consequently, the quality determination of the semiconductor device is delayed, so that the detection of the defective semiconductor device is delayed.

Therefore, in order to shorten the time from the completion of the wafer process to the measurement of the withstand voltage of the semiconductor device, the inventors have considered a method of forming a TEG (Test Element Group) for measuring the withstand voltage as another new method. As the TEG, a semiconductor element for measuring withstand voltage corresponding to a semiconductor element having a super junction structure is formed. The TEG is formed in the scribe region, avoiding the region in which the semiconductor element to be a product is formed.

The scribe region is the region that partitions the element regions. The scribe region is the region where dicing is finally performed, and it extends in strip when viewed in a plan view. Accordingly, the region where the TEG is arranged is subjected to the restriction in the width direction of the scribe region, and a sufficient length cannot be secured in the width direction.

Therefore, in the region where the TEG is arranged, the TEG (semiconductor element) breaks down in some cases particularly due to the depletion layer that is to spread in the width direction of the scribe region, among the depletion layers that spread when measuring the withstand voltage.

Therefore, in the case of the semiconductor device that is required to have a medium withstand voltage or higher, the withstand voltage cannot be accurately measured by the conventional withstand voltage measurement using the TEG, and a new method for measuring the withstand voltage of the semiconductor device has been needed.

The other problems and novel features will be apparent from the description of this specification and the accompanying drawings.

A semiconductor device according to an embodiment includes a semiconductor substrate, a column structure, and a back surface electrode. The semiconductor substrate has a first main surface and a second main surface, a first region, a second region, and a third region are defined on the first main surface, and a first conductivity type region including a substrate of a first conductivity type is arranged in the second main surface. The column structure includes a first column structure formed in the first region, a second column structure formed in the second region, and a third column structure formed in the third region formed in the semiconductor substrate. The back surface electrode is formed on the second main surface of the semiconductor substrate. The column structure includes a plurality of buried insulators, a first conductivity type region of the first conductivity type, and a second impurity region of a second conductivity type. The plurality of buried insulators is formed in the semiconductor substrate and is formed from the first main surface toward the second main surface. The first impurity region is formed in the semiconductor substrate and is formed at least from a depth position, which is located at a distance from the first main surface, to the first conductivity type region. The second impurity region is formed in the semiconductor substrate, formed at least from the depth position to the first conductivity type region, and is in contact with each of the respective buried insulator and the first impurity region. In the first column structure, the plurality of buried insulators is formed in island shapes, respectively, at a distance from each other in a plan view. The first impurity region is formed from a position shallower than the depth position to the first conductivity type region. A first resistor is formed of the first impurity region. In the second column structure, each of the plurality of buried insulators is formed so as to extend in strip in a first direction in the plan view. The second impurity region is formed from the first main surface to the first conductivity type region and is in contact with the respective buried insulator extending in strip. A second resistor is formed of the second impurity region located between a one end portion of the respective buried insulator and an another end portion of the respective buried insulator extending in strip. In the third column structure, a semiconductor element, through which a current is conducted between the first main surface and the second main surface, is formed in the semiconductor substrate.

A method of manufacturing a semiconductor device according to another embodiment includes the following steps. A semiconductor substrate having a first main surface and a second main surface in which a substrate of a first conductivity type is arranged. A scribe region including a first region and a second region is defined in the first main surface of the semiconductor substrate, and an element region partitioned by the scribe region is defined in the first main surface of the semiconductor substrate. A column structure is formed. The step of forming the column structure includes a step of forming a first column structure in the first region of the scribe region, a step of forming a second column structure in the second region of the scribe region, and a step of forming a third column structure in the element region. A semiconductor element, through which a current is conducted between the first main surface and the second main surface, is formed in a region in which the third column structure is arranged. The second main surface of the semiconductor substrate is polished and a back surface electrode is formed on the second main surface, which was polished, of the semiconductor substrate. The semiconductor substrate is diced along the scribe region, thereby obtaining the element region, in which the semiconductor element is formed therein, as a semiconductor chip. The step of forming the column structure includes the following steps. A plurality of deep trenches is formed from the first main surface toward the second main surface by forming a plurality of first deep trenches in the first region of the scribe region, forming a plurality of second deep trenches in the second region of the scribe region, and forming a plurality of third deep trenches in the element region. A first impurity of a first conductivity type is introduced through each of the plurality of deep trenches, thereby forming a first impurity region of the first conductivity type from the first main surface toward the substrate in each of the first region of the scribe region, and the second region of the scribe region and the element region. A second impurity of a second conductivity type is introduced through each of the plurality of deep trenches, thereby forming a second impurity region of the second conductivity type in an inner wall surface of each of the plurality of first deep trenches, the plurality of second deep trenches, and the plurality of third deep trenches. Each of the plurality of deep trenches is filled with an insulator, thereby forming a buried insulator so as to be in contact with the second impurity region. The step of forming the first column structure includes a step of forming the plurality of first deep trenches at a distance from each other. The step of forming the second column structure includes a step of forming at least one second deep trench of the plurality of second deep trenches so as to extend in strip in a direction in which the scribe region is extended, in a plan view. After forming the column structure and the semiconductor element and before polishing the second main surface of the semiconductor substrate, the method further includes the following steps. A first resistance value of the first impurity region in the first column structure is measured. A second resistance value of the second impurity region in the second column structure is measured. A withstand voltage of the element region is estimated by calculating a ratio of the first resistance value and the second resistance value.

By a semiconductor device according to an embodiment, it is possible to estimate the withstand voltage of the semiconductor device that is required to have a medium withstand voltage or higher.

By a method of manufacturing a semiconductor device according to another embodiment, it is possible to estimate the withstand voltage of the semiconductor device that is required to have a medium withstand voltage or higher.

DETAILED DESCRIPTION

A semiconductor device in a wafer state before dicing a semiconductor substrate will be described as an example of the semiconductor device according to the embodiment.

Figure 1:
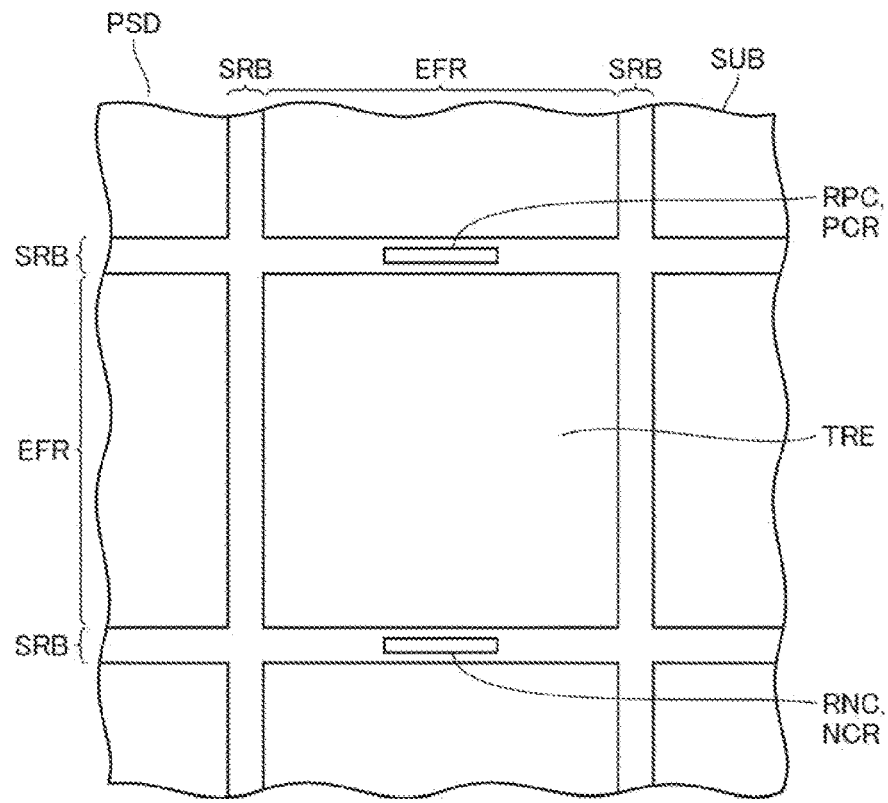
FIG. 1 is a partial plan view showing an example of a planar structure of a semiconductor device in a wafer state according to an embodiment.

As shown in FIG. 1, in a semiconductor device PSD in a wafer state, element regions EFR and scribe regions SRB are defined on one main surface (first main surface) of a semiconductor substrate SUB. The planar shape of the element region EFR is, for example, quadrangular. The element regions EFR are partitioned by the scribe regions SRB. The scribe regions SRB are defined so as to extend in strips with a predetermined width in one direction and extend in strips in another direction substantially orthogonal to the one direction.

In the element region EFR (third region), for example, a vertical MOS transistor is formed as a semiconductor element TRE. In the scribe region SRB, an n-type column region RNC (first region) and a p-type column region RPC (second region) are defined. An n-type column resistor NCR is formed in the n-type column region RNC. A p-type column resistor PCR is formed in the p-type column region RPC. As will be described later, the n-type column resistor NCR and the p-type column resistor PCR contribute to the estimation of the withstand voltage of the semiconductor device PSD.

In this embodiment, the case where the n-type column region RNC is defined in one scribe region SRB and the p-type column region RPC is defined in another scribe region SRB with respect to the element region EFR as shown in FIG. 1 will be described, but the present invention is not limited to such an arrangement form. For example, both the n-type column region RNC and the p-type column region RPC may be defined in one scribe region SRB with respect to the element region EFR. Specifically, the n-type column region RNC and the p-type column region RPC may be defined so as to be adjacent to each other in one scribe region SRB with respect to the element region EFR.

Figure 2:
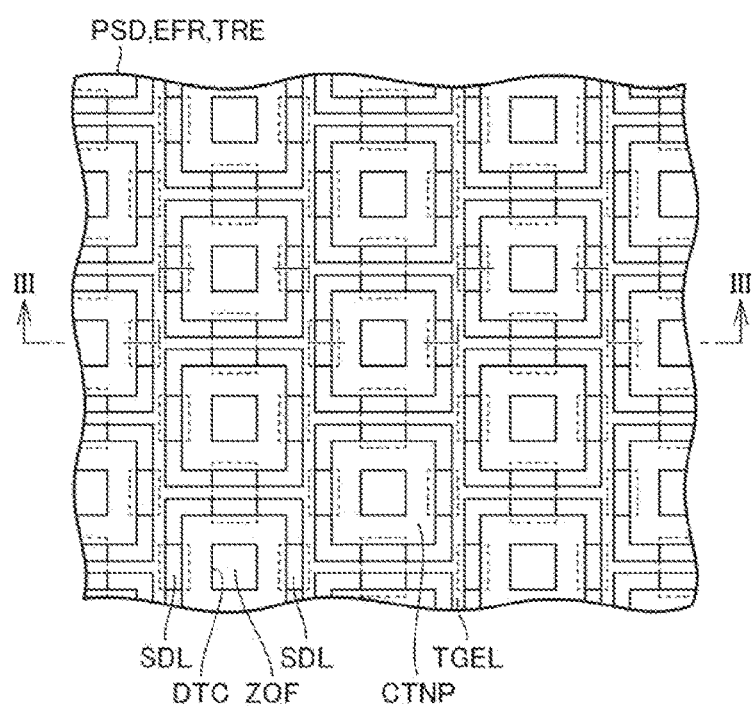
FIG. 2 is a partial plan view showing an example of a planar structure of a semiconductor element formed in an element region according to the embodiment.
Figure 3:
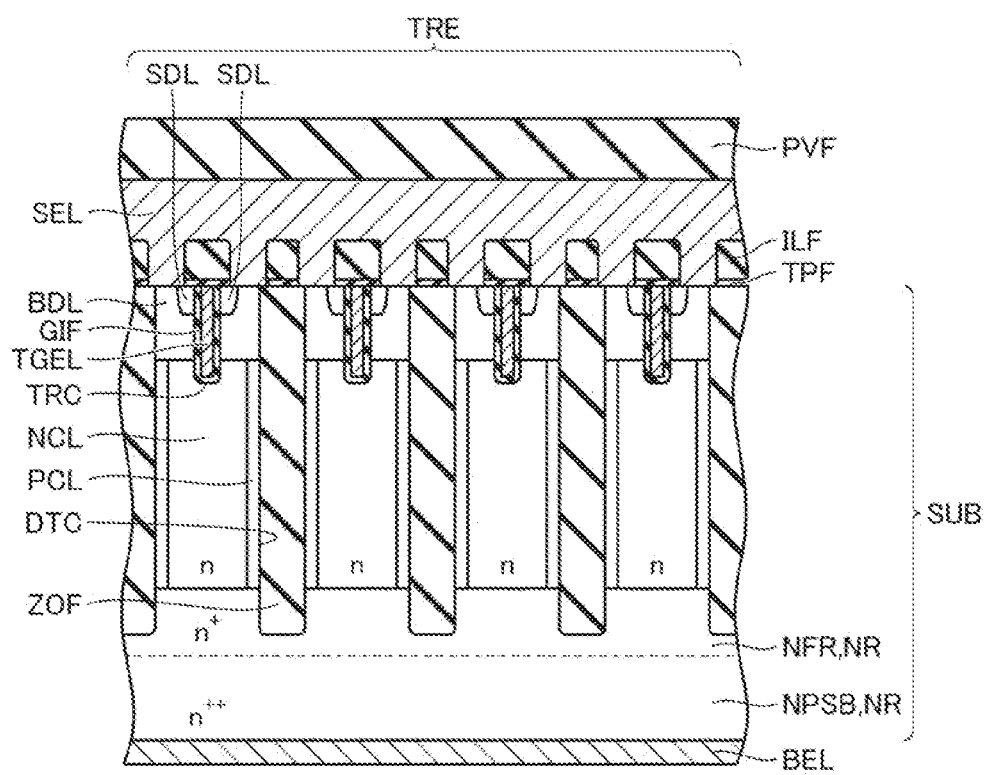
FIG. 3 is a partial cross-sectional view taken along a line III-III shown in FIG. 2 according to the embodiment.

Next, the planar structure and the cross-sectional structure of the element region EFR will be described in detail. As shown in FIG. 2 and FIG. 3, buried insulators ZOF, n-type column layers NCL (first impurity region), p-type column layers PCL (second impurity region), the semiconductor element TRE, and the like are formed in the element region EFR (third column structure).

As shown in FIG. 3, first, on the other main surface (second main surface) of the semiconductor substrate SUB, an n-type region NR including an $n^{++}$-type substrate NPSB and an n-type layer NFR arranged on the other main surface is formed. As will be described later, the n-type layer NFR is formed by an n-type impurity diffused from the $n^{++}$-type substrate NPSB during the manufacturing process. The buried insulator ZOF is formed so as to extend from one main surface of the semiconductor substrate SUB to the n-type region NR. The buried insulator ZOF is formed in a deep trench DTC. The buried insulators ZOF are arranged in island shapes (staggered arrangement) at a distance from each other in a plan view seen from one main surface of the semiconductor substrate SUB.

In the semiconductor substrate SUB, a vertical MOS transistor is formed as the semiconductor element TRE. A p-type base diffusion layer BDL is formed from one main surface (first main surface) of the semiconductor substrate SUB to a predetermined depth (depth position). In the base diffusion layer BDL, n-type source diffusion layers SDL are formed from one main surface of the semiconductor substrate SUB to a position shallower than the bottom of the base diffusion layer BDL.

Gate trenches TRC are formed from one main surface of the semiconductor substrate SUB so as to penetrate the base diffusion layer BDL. A gate electrode TGEL is formed in the gate trench TRC with a gate insulating film GIF interposed therebetween. The n-type source diffusion layer SDL is arranged on the side of the gate trench TRC (gate electrode TGEL). The gate electrodes TGEL are formed in mesh shape in a plan view seen from one main surface of the semiconductor substrate SUB. The buried insulator ZOF is arranged in the region surrounded by the gate electrodes TGEL arranged in mesh shape.

The n-type column layers NCL are formed from the bottom (depth position) of the base diffusion layer BDL to the n-type region NR in the semiconductor substrate SUB. The p-type column layers PCL are formed between the n-type column layers NCL and the buried insulators ZOF. The p-type column layer PCL is formed so as to be in contact with the n-type column layer NCL and the buried insulator ZOF. The p-type column layers PCL are formed from the bottom (depth position) of the base diffusion layer BDL to the n-type region NR in the semiconductor substrate SUB.

Further, as shown in FIG. 3, a protective insulating film TPF and an interlayer insulating film ILF are formed so as to cover the element region EFR defined on one main surface of the semiconductor substrate SUB. A source electrode SEL is formed on the interlayer insulating film ILF. The source electrode SEL is electrically connected to the source diffusion layer SDL and the base diffusion layer BDL via a contact CTNP. Further, a gate electrode pad (not shown) electrically connected to the gate electrode TGEL is formed on the interlayer insulating film ILF.

On the other hand, as shown in FIG. 3, a back surface electrode BEL is formed on the other main surface (second main surface) of the semiconductor substrate SUB. The back surface electrode BEL is electrically connected to the n-type region NR including the $n^{++}$-type substrate NPSB arranged in the other main surface (second main surface) of the semiconductor substrate SUB. In this embodiment, the $n^{++}$-type substrate NPSB is a drain constituting the vertical MOS transistor. In this vertical MOS transistor, a current is conducted between the source electrode SEL and the back surface electrode BEL by applying a desired voltage to the gate electrode TGEL.

Figure 4:
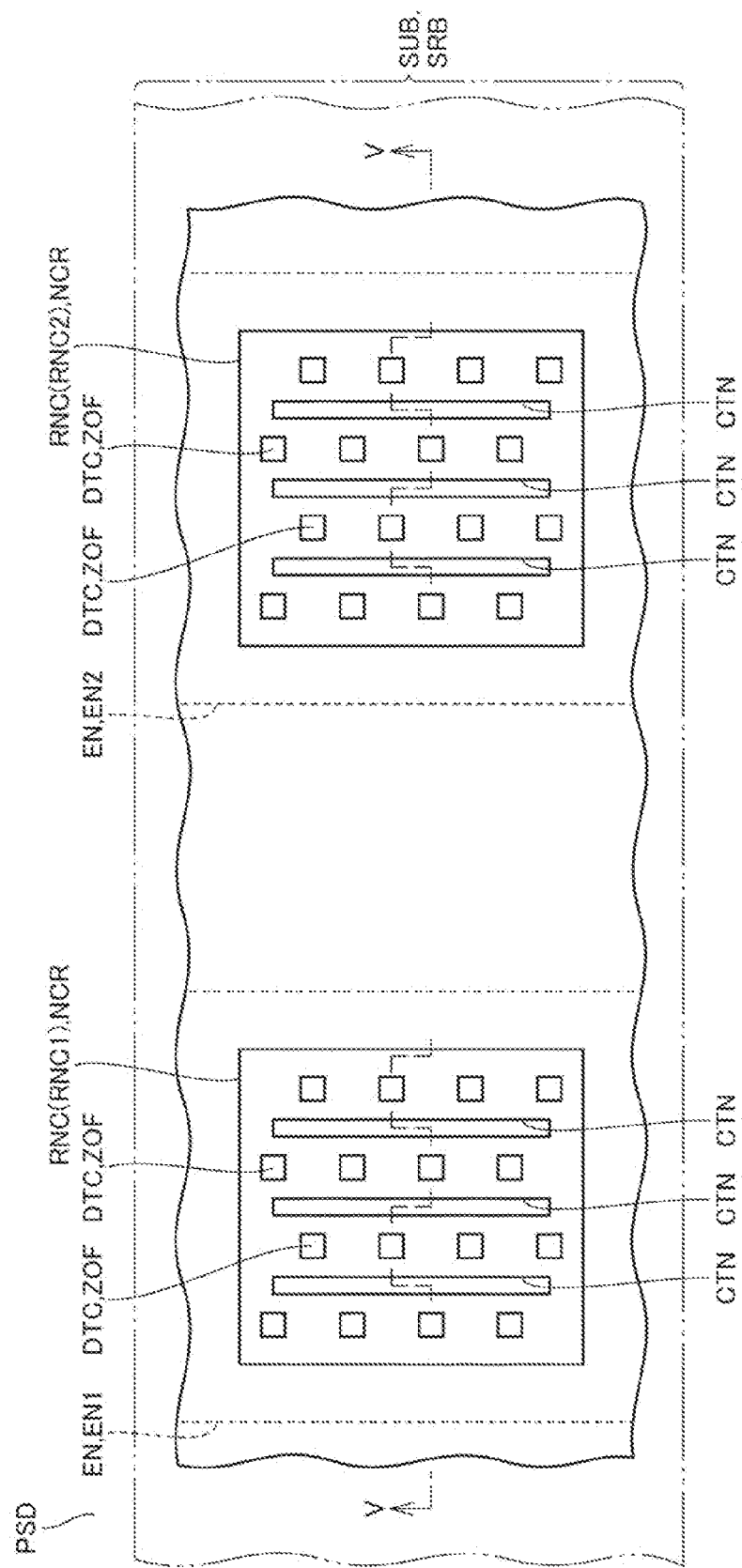
FIG. 4 is a partial plan view showing an example of a planar structure of an n-type column resistor formed in an n-type column region defined in a scribe region according to the embodiment.
Figure 5:
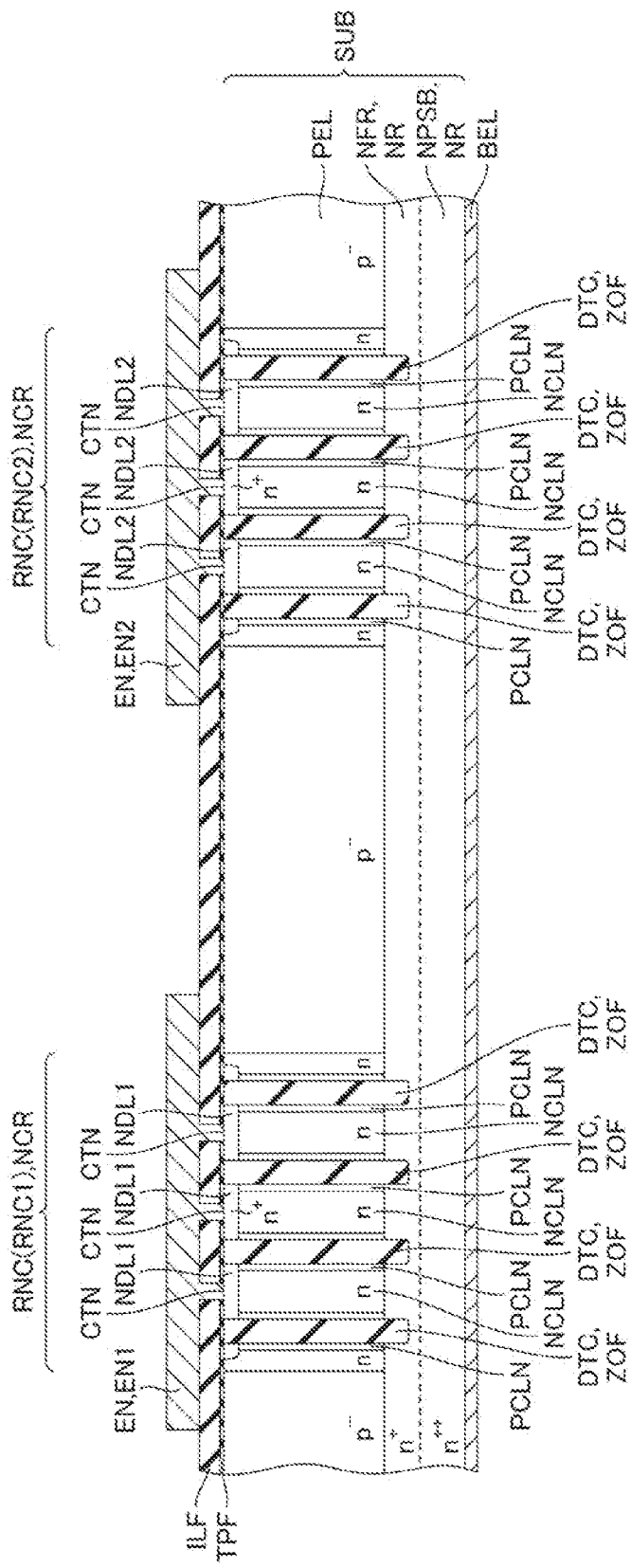
FIG. 5 is a partial cross-sectional view taken along a line V-V shown in FIG. 4 according to the embodiment.

Next, the planar structure and the cross-sectional structure of the n-type column region RNC will be described in detail. As shown in FIG. 4 and FIG. 5, two n-type column regions RNC, that is, an n-type column region RNC1 and an n-type column region RNC2 are defined in the scribe region SRB. The n-type column region RNC1 and the n-type column region RNC2 are defined at a distance in the direction in which the scribe region SRB extends. In each of the n-type column region RNC1 and the n-type column region RNC2, an n-type column layer NCLN (first impurity region), a p-type column layer PCLN (second impurity region), the buried insulator ZOF, and the like are formed (first column structure, first portion of first column structure, second portion of first column structure).

In the n-type column region RNC1, an n-type diffusion layer NDL1 is formed from one main surface (first main surface) of the semiconductor substrate SUB to a position shallower than the bottom (depth position) of the base diffusion layer BDL. In the n-type column region RNC2, an n-type diffusion layer NDL2 is formed from one main surface (first main surface) of the semiconductor substrate SUB to a position shallower than the bottom (depth position) of the base diffusion layer BDL. In each of the n-type column region RNC1 and the n-type column region RNC2, the n-type column layer NCLN is formed from the position shallower than the bottom (depth position) of the base diffusion layer BDL to the n-type region NR in the semiconductor substrate SUB. The impurity concentration of the n-type diffusion layer NDL1 is higher than the impurity concentration of the n-type column layer NCLN. The impurity concentration of the n-type diffusion layer NDL2 is higher than the impurity concentration of the n-type column layer NCLN.

Further, in each of the n-type column region RNC1 and the n-type column region RNC2, the p-type column layer PCLN is formed from the position shallower than the bottom (depth position) of the base diffusion layer BDL to the n-type region NR in the semiconductor substrate SUB. The p-type column layer PCLN is formed between the n-type column layer NCLN and the buried insulator ZOF. The p-type column layer PCLN is formed so as to be in contact with the n-type column layer NCLN and the buried insulator ZOF. The n-type column resistor NCR is substantially composed of the n-type column layer NCLN.

The buried insulator ZOF is formed from one main surface of the semiconductor substrate SUB to the n-type region NR. The buried insulators ZOF are arranged in island shapes (staggered arrangement) at a distance from each other in a plan view seen from one main surface of the semiconductor substrate SUB. The protective insulating film TPF and the interlayer insulating film ILF are formed so as to cover the n-type column region RNC defined on one main surface of the semiconductor substrate SUB.

An electrode EN is formed on the interlayer insulating film ILF. The electrode EN includes an electrode EN1 and an electrode EN2. The electrode EN1 is formed in the n-type column region RNC1. The electrode EN2 is formed in the n-type column region RNC2. The electrode EN1 is electrically connected to the n-type column layer NCLN via the contact CTN and the n-type diffusion layer NDL1. The electrode EN2 is electrically connected to the n-type column layer NCLN via the contact CTN and the n-type diffusion layer NDL2.

The n-type column layer NCLN in the n-type column region RNC1 and the n-type column layer NCLN in the n-type column region RNC2 are electrically connected via the $n^{++}$-type substrate NPSB (n-type region NR) in the semiconductor substrate SUB. As will be described later, for example, the resistance value of the n-type column resistor NCR (n-type column layer NCLN) is measured by passing a current between the electrodes EN1 and EN2 by the two-terminal method.

Figure 6:
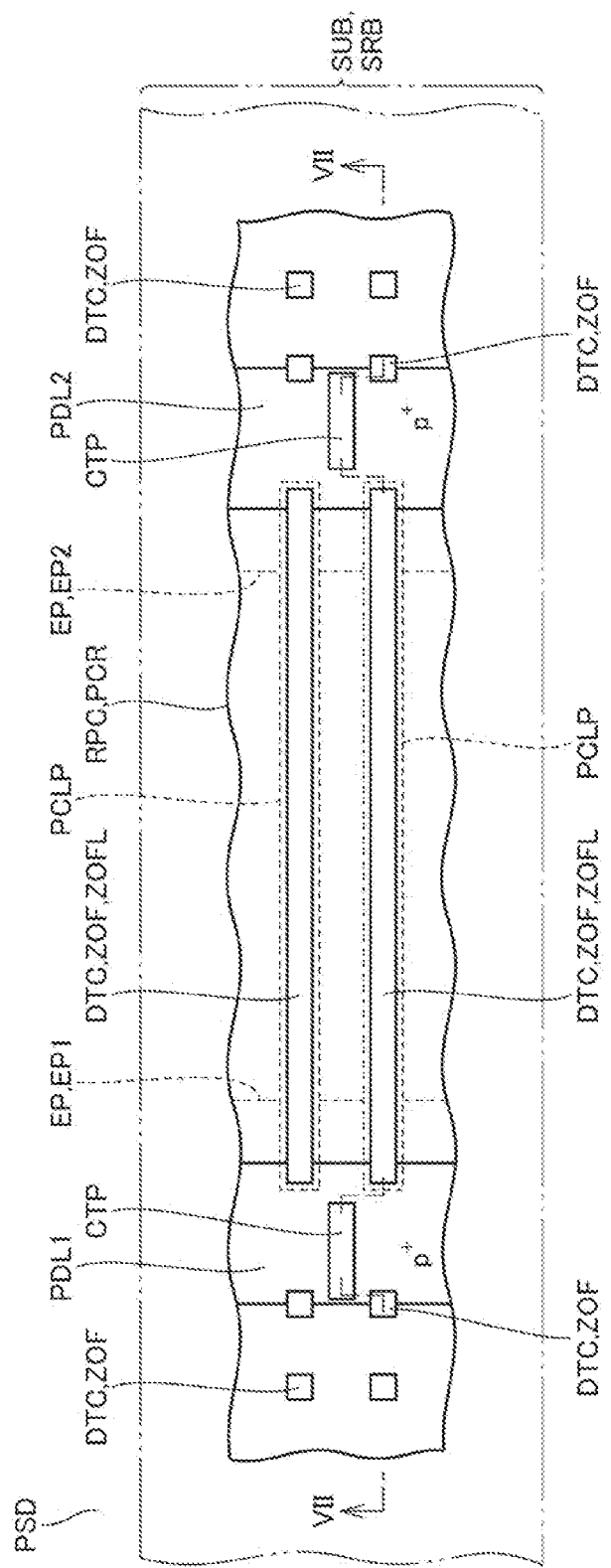
FIG. 6 is a partial plan view showing an example of a planar structure of a p-type column resistor formed in a p-type column region defined in the scribe region according to the embodiment.
Figure 7:
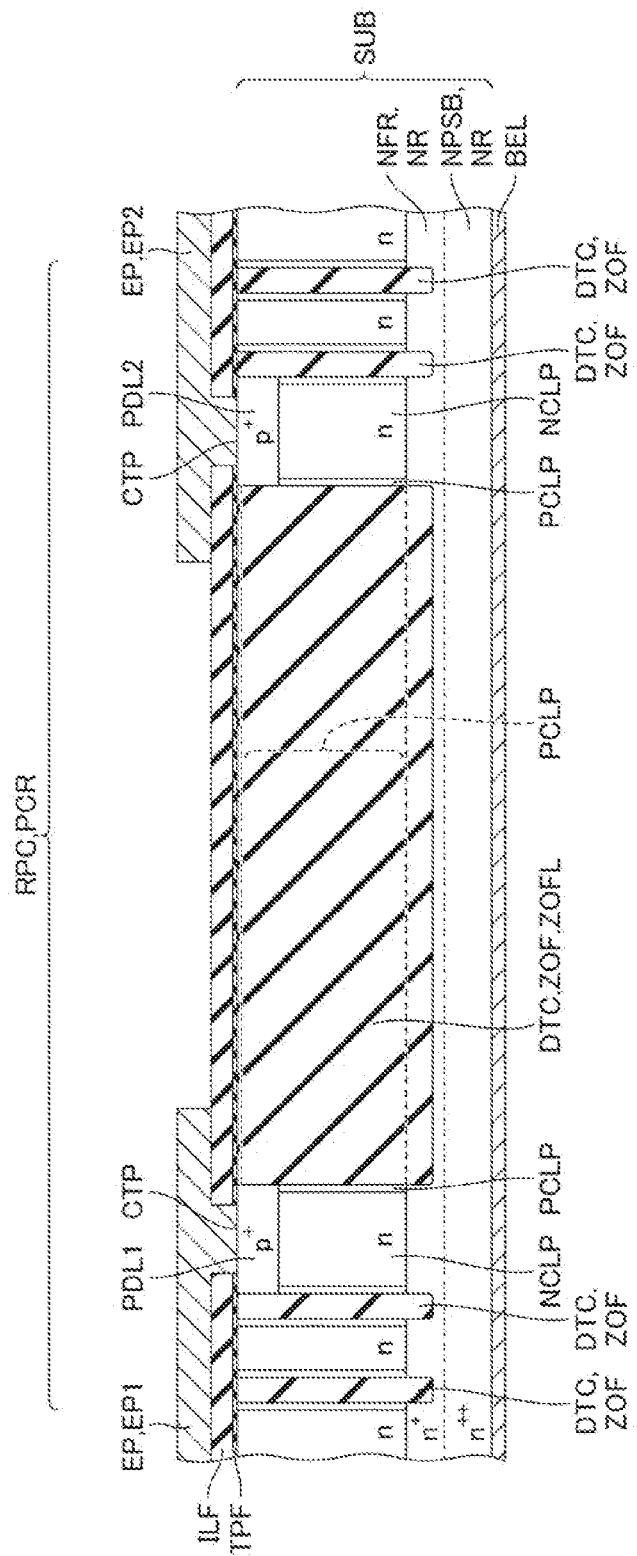
FIG. 7 is a partial cross-sectional view taken along a line VII-VII shown in FIG. 6 according to the embodiment.

Next, the planar structure and the cross-sectional structure of the p-type column region RPC will be described in detail. As shown in FIG. 6 and FIG. 7, the p-type column region RPC is defined in the scribe region SRB. In the p-type column region RPC, an n-type column layer NCLP (first impurity region), a p-type column layer PCLP (second impurity region), the buried insulator ZOF, and the like are formed (second column structure).

The buried insulator ZOF includes a buried insulator ZOFL. The buried insulator ZOFL is formed so as to extend in strip along the direction in which the scribe region SRB extends in a plan view seen from one main surface of the semiconductor substrate SUB. The buried insulator ZOFL (ZOF) is formed from one main surface of the semiconductor substrate SUB to the n-type region NR.

The buried insulator ZOF includes a buried insulator ZOFL. The buried insulator ZOFL is formed so as to extend in strip along the direction in which the scribe region SRB extends in a plan view seen from one main surface of the semiconductor substrate SUB. The buried insulator ZOFL (ZOF) is formed from one main surface (first main surface) of the semiconductor substrate SUB to the n-type region NR.

The p-type column layer PCLP is formed from one main surface (first main surface) of the semiconductor substrate SUB to the n-type region NR. The p-type column layer PCLP is formed between the buried insulator ZOFL extending in strip and the n-type column layer NCLN. The p-type column layer PCLP is formed so as to be in contact with the buried insulator ZOFL extending in strip and the n-type column layer NCLN.

Further, in the p-type column region RPC, a p-type diffusion layer PDL1 and a p-type diffusion layer PDL2 are formed, respectively. Each of the p-type diffusion layer PDL1 and the p-type diffusion layer PDL2 is formed from one main surface (first main surface) of the semiconductor substrate SUB to a predetermined depth (depth position). The p-type diffusion layer PDL1 and the p-type diffusion layer PDL2 are formed at a distance in the direction in which the scribe region SRB extends.

The p-type diffusion layer PDL1 is in contact with the p-type column layer PCLP on one end side of the buried insulator ZOFL. The p-type diffusion layer PDL2 is in contact with the p-type column layer PCLP on the other end side of the buried insulator ZOFL. The impurity concentration of the p-type diffusion layer PDL1 is higher than the impurity concentration of the p-type column layer PCLP. The impurity concentration of the p-type diffusion layer PDL2 is higher than the impurity concentration of the p-type column layer PCLP. The p-type column resistor PCR is substantially composed of the p-type column layer PCLP.

The n-type column layer NCLP is formed from the bottom (depth position) of the base diffusion layer BDL to the n-type region NR in the semiconductor substrate SUB. Further, in the region where the p-type diffusion layer PDL1 and the p-type diffusion layer PDL2 are not formed in the p-type column region RPC, the n-type column layer NCLP is formed from one main surface of the semiconductor substrate SUB to the n-type region NR.

The protective insulating film TPF and the interlayer insulating film ILF are formed so as to cover the p-type column region RPC defined on one main surface of the semiconductor substrate SUB. An electrode EP is formed on the interlayer insulating film ILF. The electrode EP includes an electrode EP1 and an electrode EP2. The electrode EP1 is electrically connected to the p-type column layer PCLP via the contact CTP and the p-type diffusion layer PDL1. The electrode EP2 is electrically connected to the p-type column layer PCLP via the contact CTP and the p-type diffusion layer PDL2. As will be described later, for example, the resistance value of the p-type column resistor PCR (p-type column layer PCLP) is measured by passing a current between the electrodes EP1 and EP2 by the two-terminal method.

Here, the semiconductor device PSD in a wafer state has been described as an example. Finally, the semiconductor device PSD is obtained by dicing the scribe region SRB to take the element region EFR as a semiconductor chip.

Further, the case where the n-type column region RNC and the p-type column region RPC are defined in the scribe region SRB has been described as an example. If the occupied area of the element region EFR has a margin for defining the n-type column region RNC and the p-type column region RPC, the n-type column region RNC and the p-type column region RPC may be arranged in the element region EFR. In this case, the n-type column resistor NCR and the p-type column resistor PCR remain in the semiconductor device PSD taken out as a semiconductor chip.

Next, an example of the method of manufacturing the semiconductor device PSD mentioned above will be described. First, the semiconductor substrate SUB (see FIG. 8) having the $n^{++}$-type substrate NPSB and a $p^-$-type epitaxial layer PEL is prepared. Next, the element region EFR and the scribe region SRB are defined on one main surface of the semiconductor substrate SUB.

Figure 8:
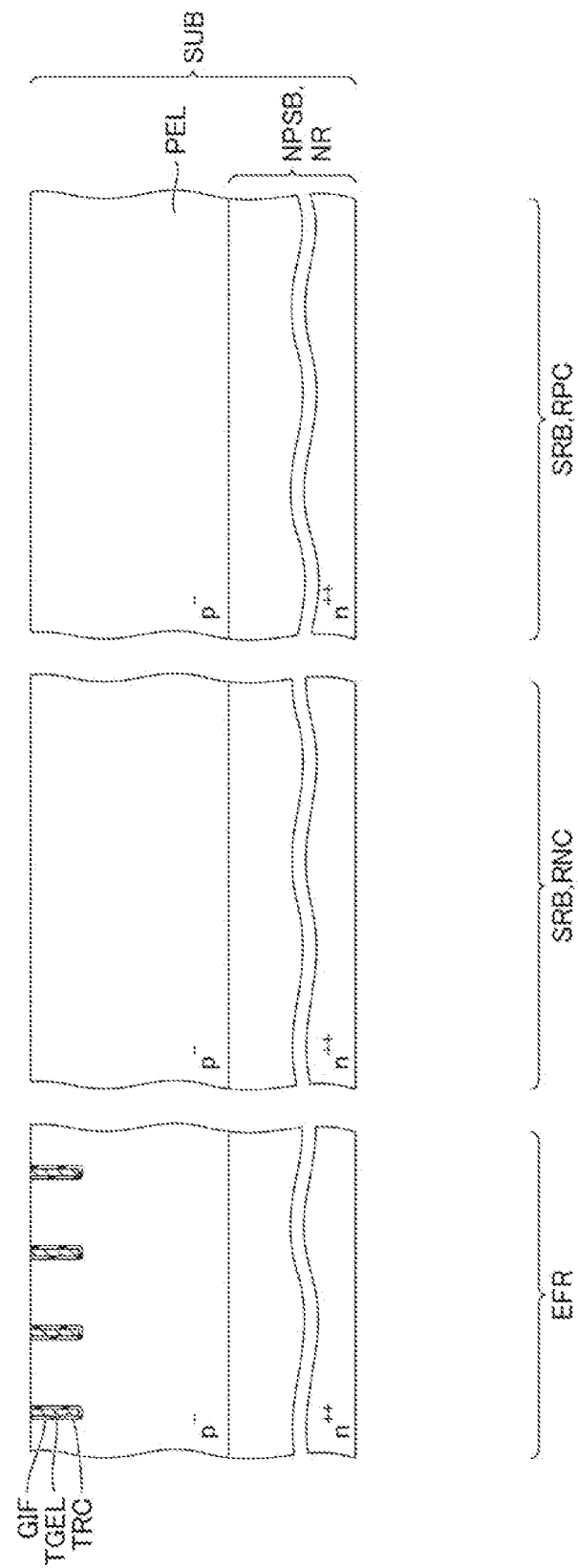
FIG. 8 is a partial cross-sectional view of the element region and the scribe region showing a step of a method of manufacturing a semiconductor device according to the embodiment.

Further, in the scribe region SRB, the n-type column region RNC and the p-type column region RPC are defined (see FIG. 1 and FIG. 8). Regarding the n-type column region RNC and the p-type column region RPC, about half of the regions are shown in the drawings showing the manufacturing process in consideration of the symmetry of the structure.

Next, gate trenches having a predetermined depth are formed from the surface of the $p^-$-type epitaxial layer PEL located in the element region EFR. Next, by performing the thermal oxidation treatment, a silicon oxide film is formed on the surface of the $p^-$-type epitaxial layer PEL including the portion of the $p^-$-type epitaxial layer PEL exposed in the gate trenches. Next, for example, a polysilicon film is formed to fill the inside of the gate trenches.

Next, the portion of the polysilicon film and the portion of the silicon oxide film located on the upper surface of the $p^-$-type epitaxial layer PEL are removed. As a result, as shown in FIG. 8, the portions of the silicon oxide film left in the gate trenches TRC are formed as the gate insulating films GIF. Further, the portions of the polysilicon film left in the gate trenches TRC are formed as the gate electrodes TGEL.

Figure 9:
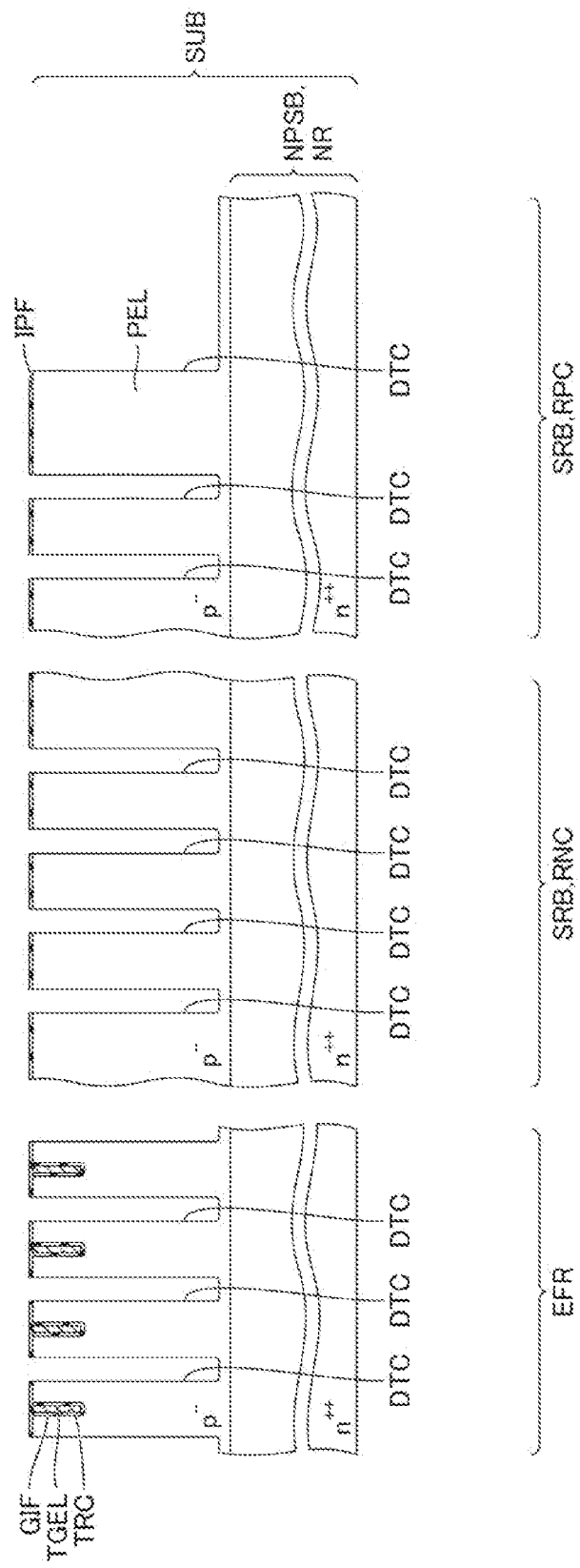
FIG. 9 is a partial cross-sectional view of the element region and the scribe region showing a step performed after the step shown in FIG. 8 according to the embodiment.

Next, by performing the heat treatment, the protective insulating film IPF (see FIG. 9) is formed on the surface of the $p^-$-type epitaxial layer PEL. Next, as shown in FIG. 9, deep trenches DTC (first deep trench, second deep trench, third deep trench) are formed in the element region EFR, the n-type column region RNC, and the p-type column region RPC, respectively, by performing the predetermined photolithography process and etching process. The deep trench DTC is formed from the surface of the $p^-$-type epitaxial layer PEL to the $n^{++}$-type substrate NPSB.

In each of the element region EFR, the n-type column region RNC, and the p-type column region RPC, the deep trenches DTC are formed in island shapes at intervals from each other in a plan view seen from the main surface of the semiconductor substrate SUB. In the p-type column region RPC, the deep trench DTC is further formed in strip along the direction in which the scribe region SRB extends (see FIG. 6).

Figure 10:
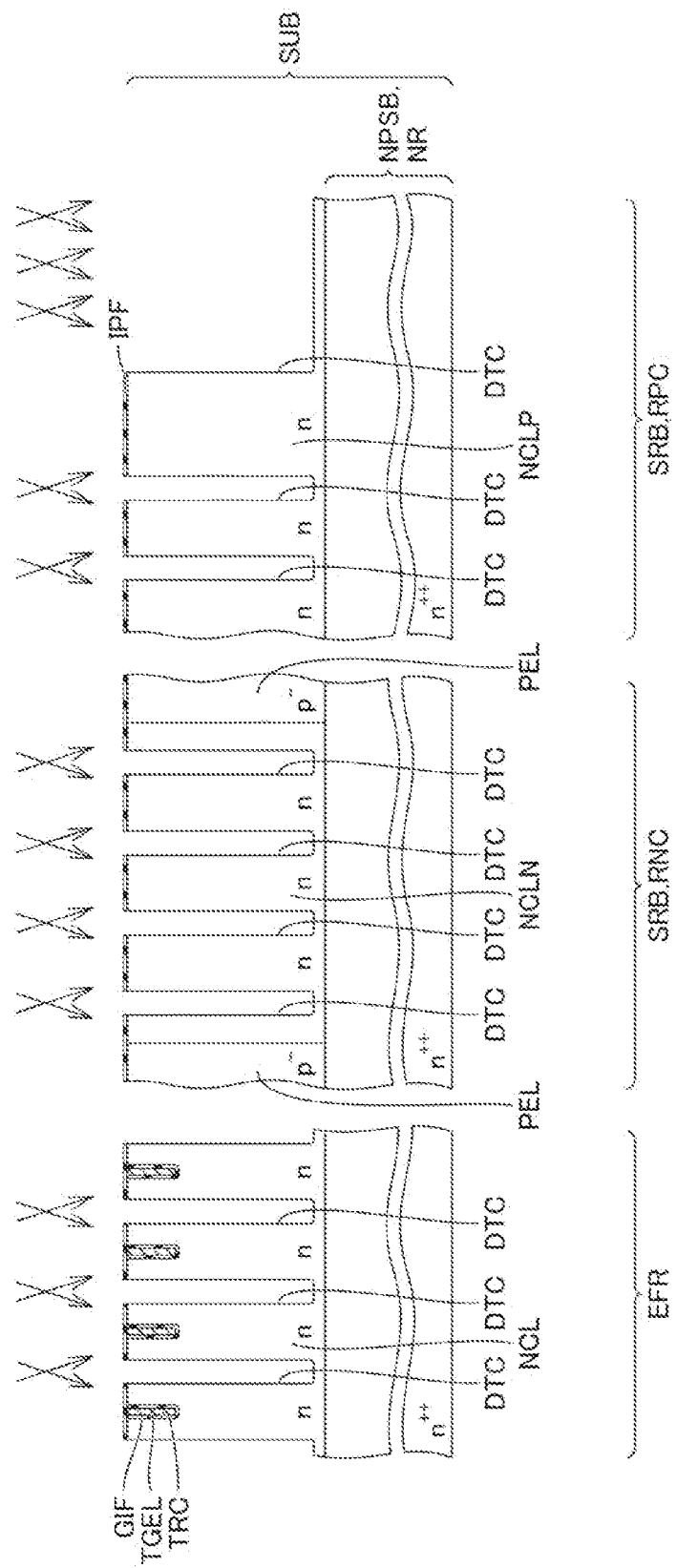
FIG. 10 is a partial cross-sectional view of the element region and the scribe region showing a step performed after the step shown in FIG. 9 according to the embodiment.

Next, as shown in FIG. 10, an n-type impurity is obliquely implanted via the protective insulating film IPF and the deep trench DTC. The dose amount of the n-type impurity in this implantation process is, for example, about $1.0 \times 10^{14}/cm^2$ to $2.0 \times 10^{14}/cm^2$. Next, by performing the heat treatment, the n-type column layer NCL is formed in the element region EFR. In the n-type column region RNC, the n-type column layer NCLN is formed. In this case, the resistance value of the n-type column layer NCLN (n-type column resistor NCR) is about 300Ω to 600Ω. In the p-type column region RPC, the n-type column layer NCLP is formed.

Figure 11:
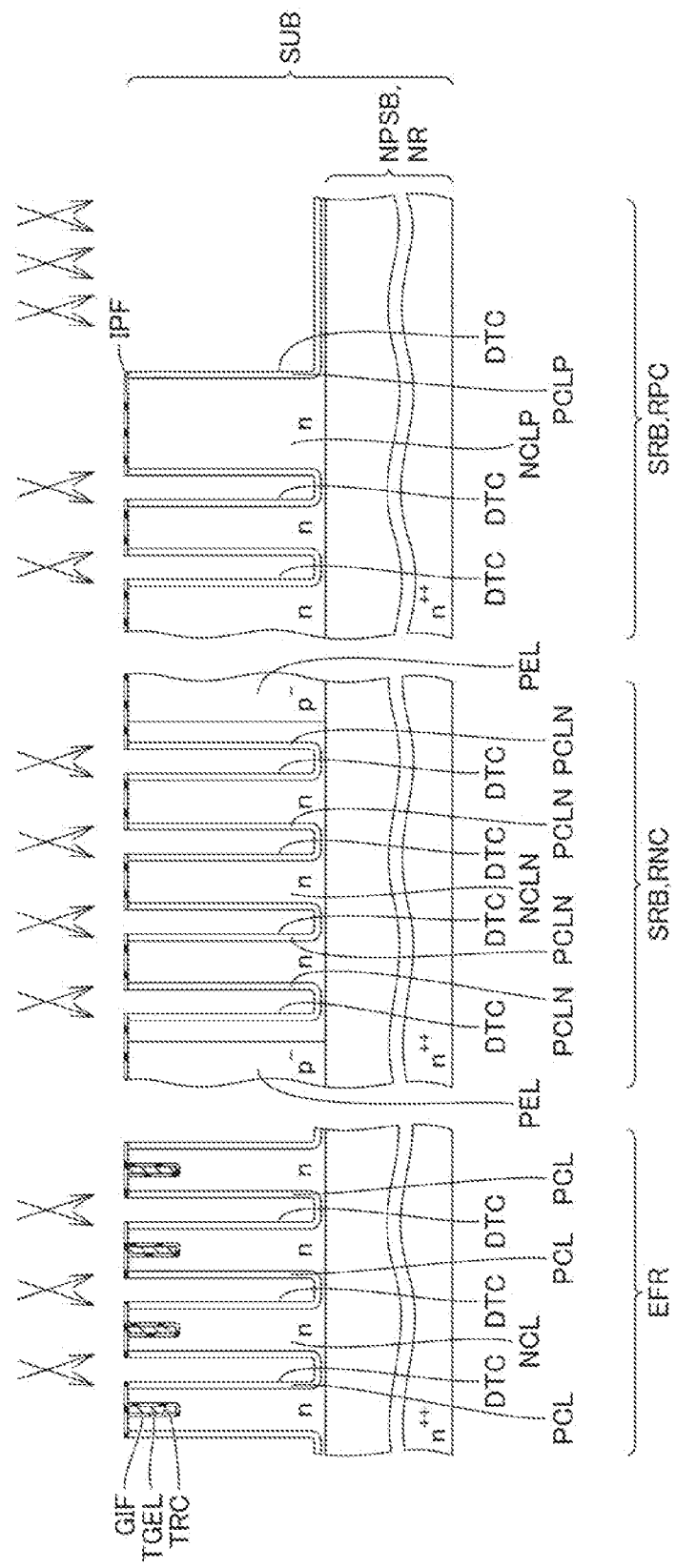
FIG. 11 is a partial cross-sectional view of the element region and the scribe region showing a step performed after the step shown in FIG. 10 according to the embodiment.

Next, as shown in FIG. 11, a p-type impurity is obliquely implanted via the protective insulating film IPF and the deep trench DTC. The dose amount of the p-type impurity in this implantation process is, for example, about $1.0 \times 10^{14}/cm^2$ to $2.0 \times 10^{14}/cm^2$. The p-type impurity is implanted from the inner wall surface exposed in the deep trench DTC toward the inside of the $p^-$-type epitaxial layer PEL. Next, by performing the heat treatment, the p-type column layer PCL is formed in the element region EFR. In the n-type column region RNC, the p-type column layer PCLN is formed. In the p-type column region RPC, the p-type column layer PCLP is formed. In this case, the resistance value of the p-type column layer PCLP (p-type column resistor PCR) is about 20000Ω to 30000Ω.

Next, a silicon oxide film (not shown) is formed by, for example, the CVD method so as to fill the deep trench DTC. Next, for example, by performing the chemical mechanical polishing process (CMP), the portion of the silicon oxide film located on the upper surface of the semiconductor substrate SUB is removed while leaving the portion of the silicon oxide film located in the deep trench DTC.

Figure 12:
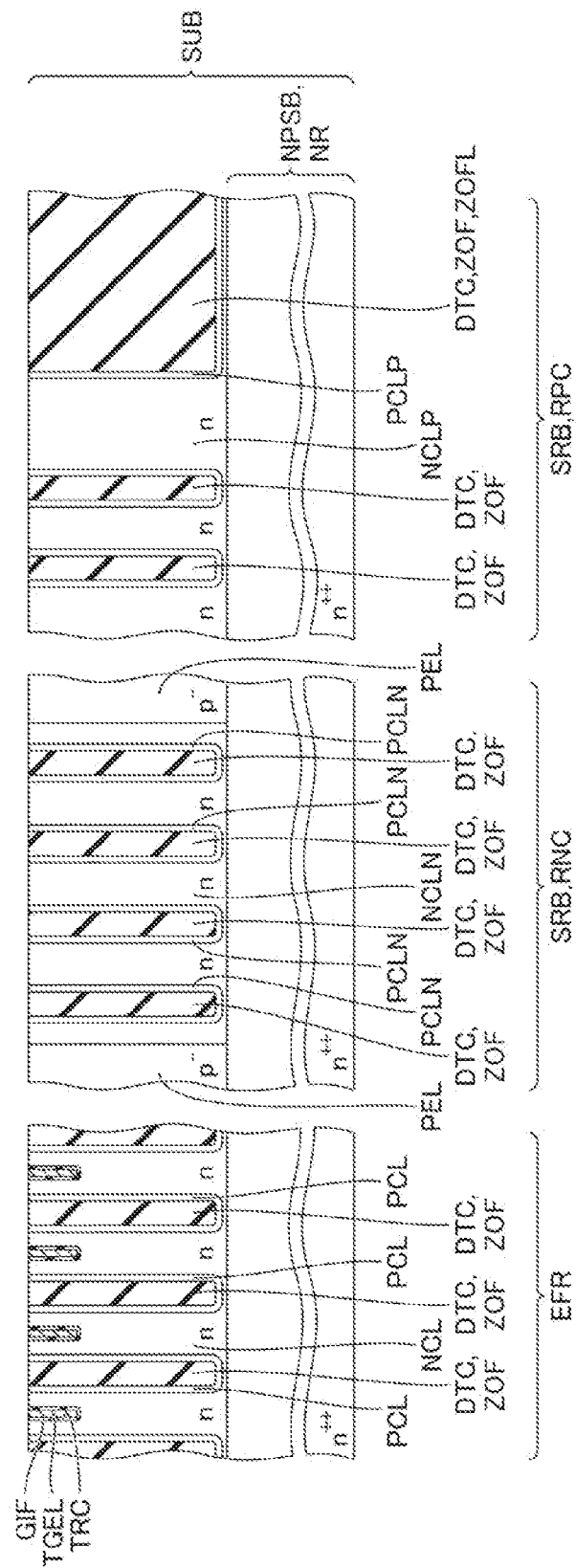
FIG. 12 is a partial cross-sectional view of the element region and the scribe region showing a step performed after the step shown in FIG. 11 according to the embodiment.

As a result, as shown in FIG. 12, the buried insulator ZOF is formed in the deep trench DTC in each of the element region EFR, the n-type column region RNC, and the p-type column region RPC. In the p-type column region RPC, the buried insulator ZOFL is further formed in the deep trench DTC formed in strip along the direction in which the scribe region SRB extends. The buried insulators ZOF are formed in island shapes in a plan view.

The buried insulator ZOFL is formed in strip along the direction in which the scribe region SRB extends in a plan view. The buried insulator ZOFL is in contact with the p-type column layer PCLP formed on the inner wall surface of the deep trench DTC extending in strip.

Figure 13:
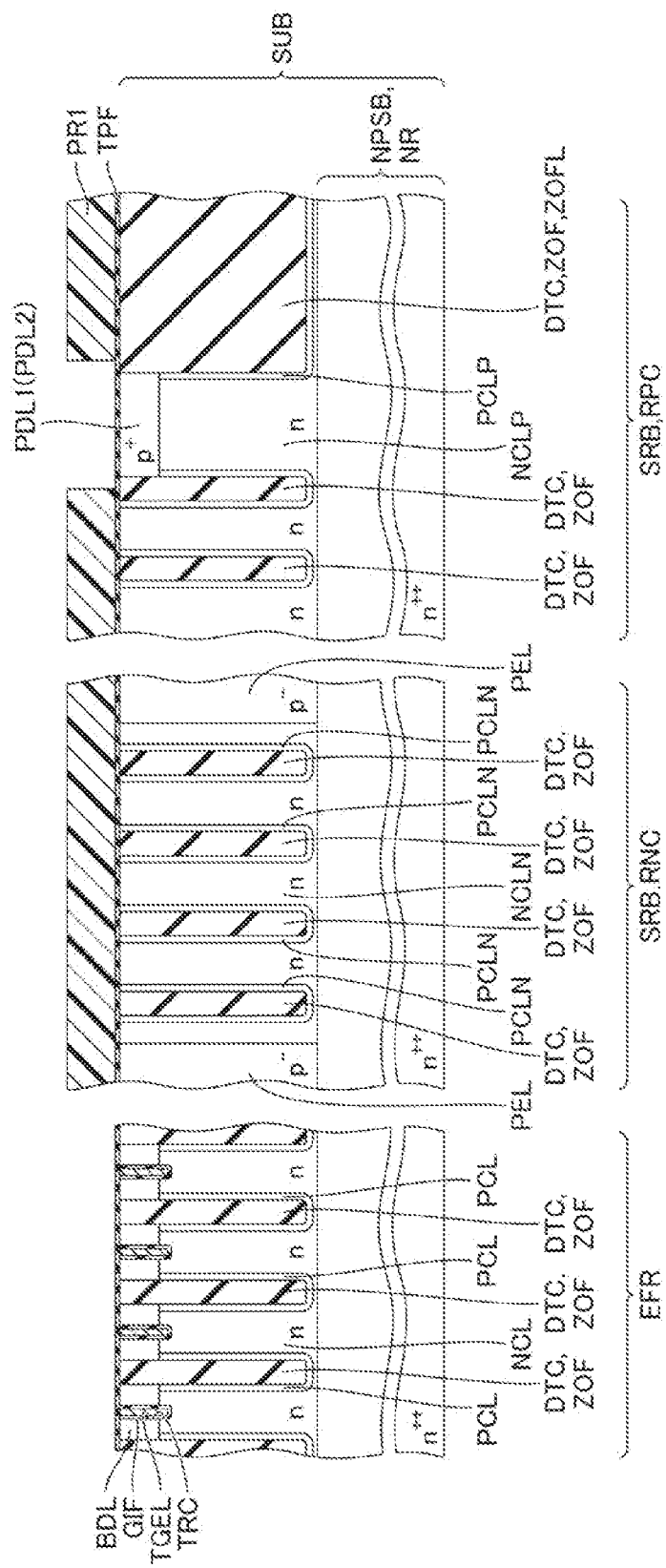
FIG. 13 is a partial cross-sectional view of the element region and the scribe region showing a step performed after the step shown in FIG. 12 according to the embodiment.

Next, by performing thermal oxidation treatment, the surface of the semiconductor substrate SUB is oxidized to form the protective insulating film TPF (see FIG. 13). Next, a photoresist pattern PR1 (see FIG. 13) is formed by performing the predetermined photolithography process. Next, as shown in FIG. 13, a p-type impurity is implanted by using the photoresist pattern PR1 as an implantation mask. As a result, the base diffusion layer BDL is formed in the element region EFR.

In the p-type column region RPC, the p-type diffusion layer PDL1 and the p-type diffusion layer PDL2 are formed. The p-type diffusion layer PDL1 and the p-type diffusion layer PDL2 are to be in contact with the p-type column layer PCLP. Thereafter, the photoresist pattern PR1 is removed.

Figure 14:
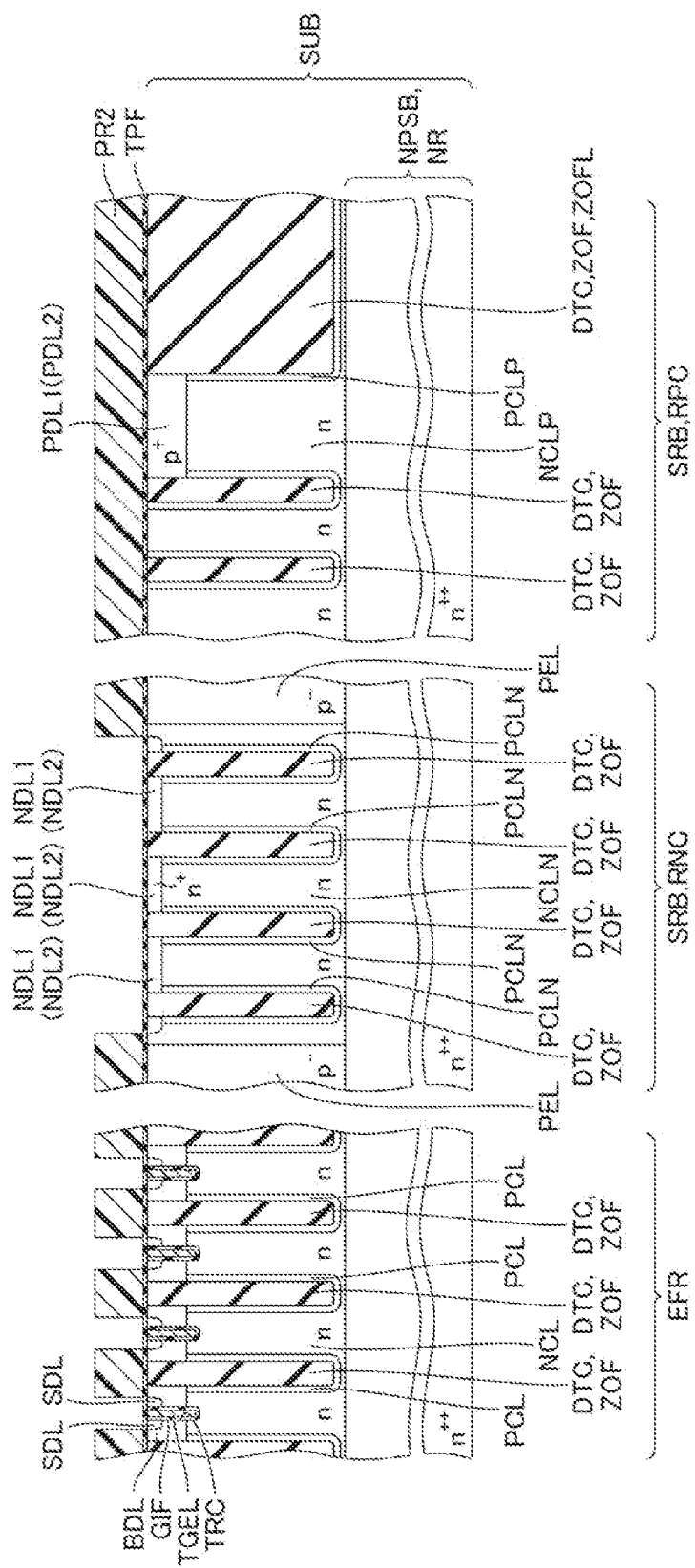
FIG. 14 is a partial cross-sectional view of the element region and the scribe region showing a step performed after the step shown in FIG. 13 according to the embodiment.

Next, a photoresist pattern PR2 (see FIG. 14) is formed by performing the predetermined photolithography process. Next, as shown in FIG. 14, an n-type impurity is implanted by using the photoresist pattern PR2 as an implantation mask. As a result, the source diffusion layer SDL is formed in the element region EFR. In the n-type column region RNC, the n-type diffusion layer NDL1 and the n-type diffusion layer NDL2 are formed. The n-type diffusion layer NDL1 and the n-type diffusion layer NDL2 are to be in contact with the n-type column layer NCLN. Thereafter, the photoresist pattern PR2 is removed.

Figure 15:
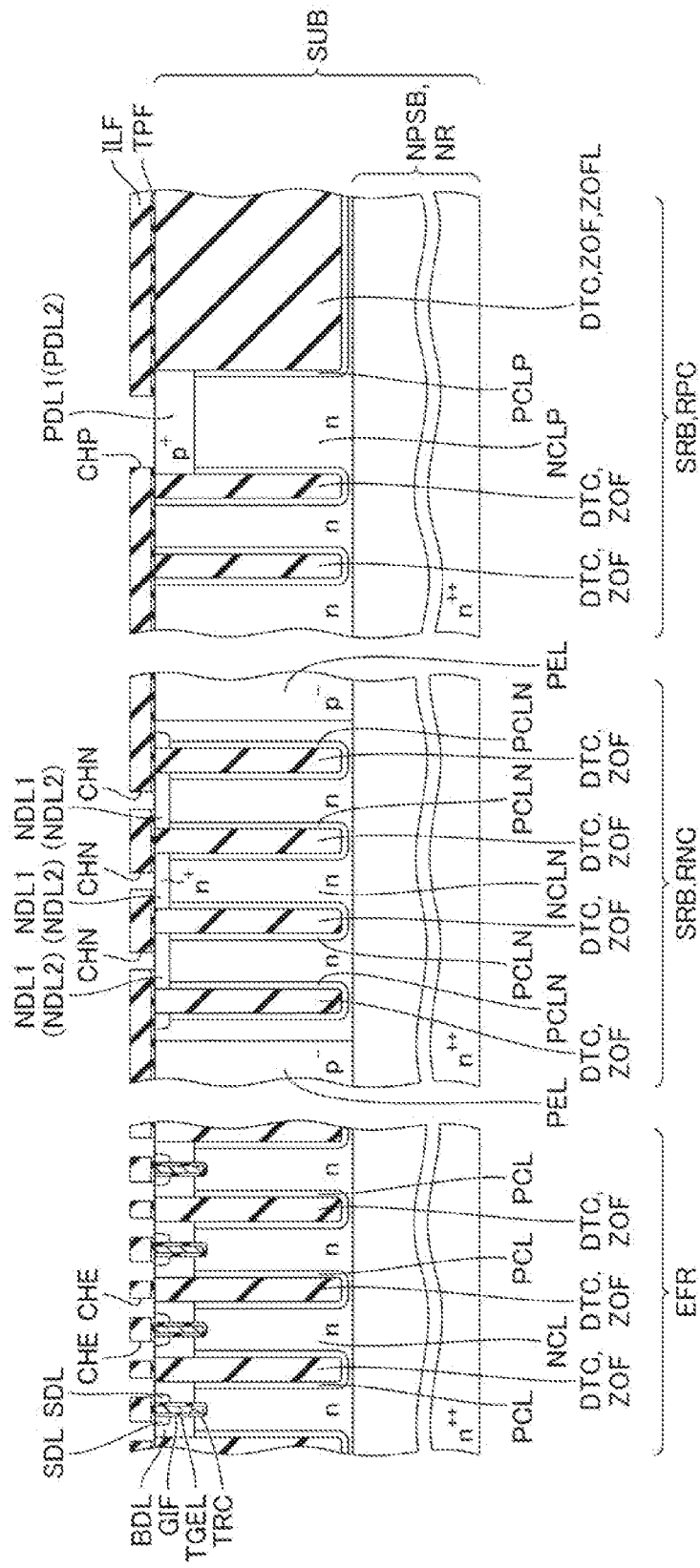
FIG. 15 is a partial cross-sectional view of the element region and the scribe region showing a step performed after the step shown in FIG. 14 according to the embodiment.

Next, the interlayer insulating film ILF (see FIG. 15) is formed so as to cover the semiconductor substrate SUB (protective insulating film TPF). Next, the predetermined photolithography process and etching process are performed on the interlayer insulating film. As a result, as shown in FIG. 15, an opening CHE that exposes the source diffusion layer SDL and the base diffusion layer BDL is formed in the element region EFR. In the n-type column region RNC, an opening CHN that exposes the n-type diffusion layers NDL1 and NDL2 is formed. In the p-type column region RPC, an opening CHP that exposes the p-type diffusion layers PDL1 and PDL2 is formed.

Figure 16:
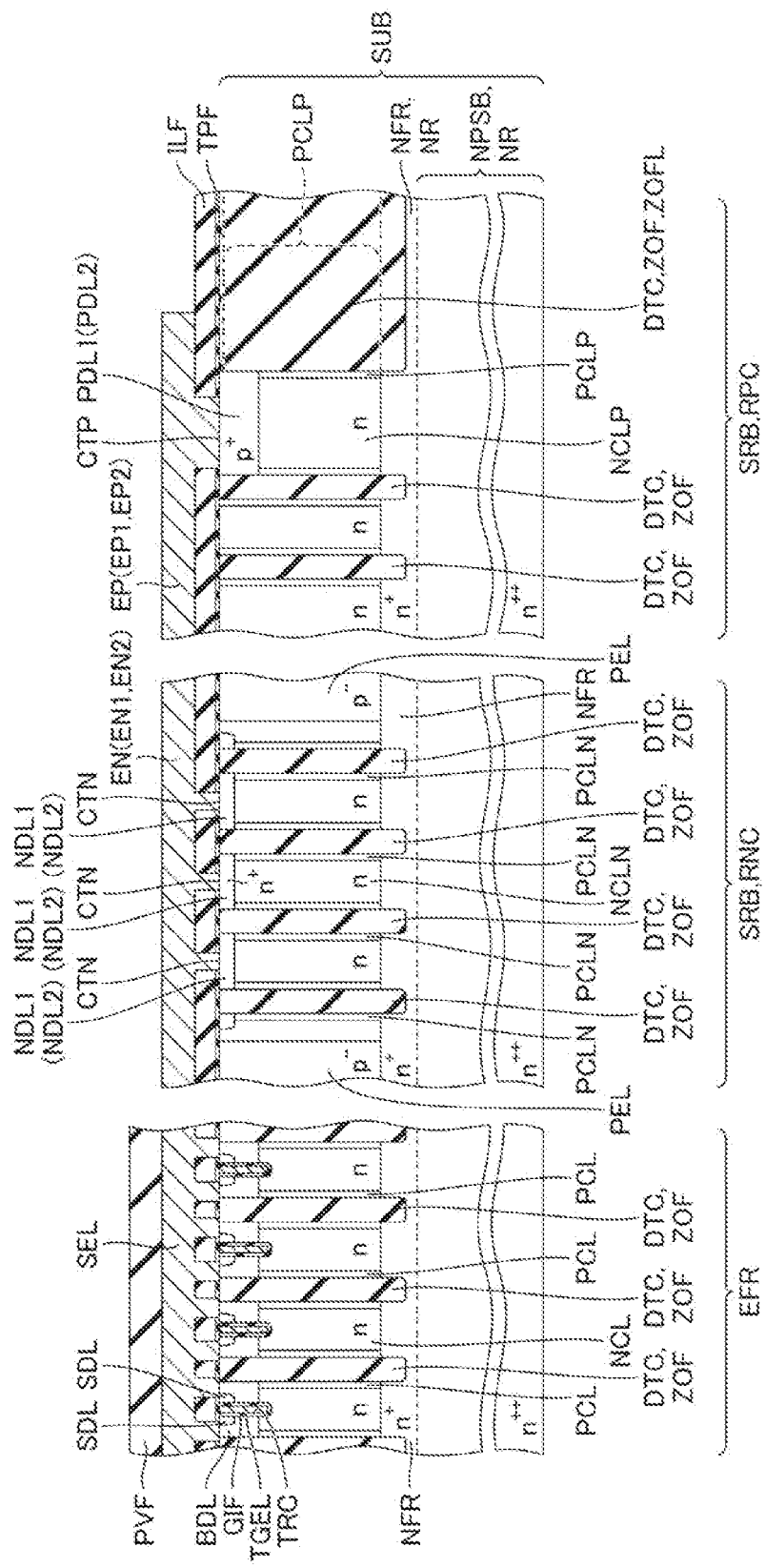
FIG. 16 is a partial cross-sectional view of the element region and the scribe region showing a step performed after the step shown in FIG. 15 according to the embodiment.

Next, an aluminum film (not shown) is formed so as to cover the interlayer insulating film ILF by, for example, the sputtering method. Next, the predetermined photolithography process and etching process are performed on the aluminum film. As a result, as shown in FIG. 16, the source electrode SEL, the electrode pad (not shown), and the like are formed in the element region EFR. The source electrode SEL is in contact with the source diffusion layer SDL and the base diffusion layer BDL.

In the n-type column region RNC, the electrode EN is formed. The electrode EN includes the electrode EN1 and the electrode EN2. The electrode EN1 is in contact with the n-type diffusion layer NDL1. The electrode EN2 is in contact with the n-type diffusion layer NDL2. In the p-type column region RPC, the electrode EP is formed. The electrode EP includes the electrode EP1 and the electrode EP2. The electrode EP1 is in contact with the p-type diffusion layer PDL1. The electrode EP2 is in contact with the p-type diffusion layer PDL2.

Thereafter, a passivation film PVF is formed by forming, for example, a silicon nitride film so as to cover the semiconductor substrate SUB. In this way, a series of wafer processes for forming the semiconductor element TRE and the like on one main surface of the semiconductor substrate SUB is completed. Along with the heat treatment performed during the series of wafer processes, the n-type impurity contained in the $n^{++}$-type substrate NPSB gradually diffuses toward one main surface side of the semiconductor substrate SUB, and finally the n-type layer NFR is formed. On the other main surface of the semiconductor substrate SUB, the n-type region NR is formed by the $n^{++}$-type substrate NPSB and the n-type layer NFR.

Figure 17:
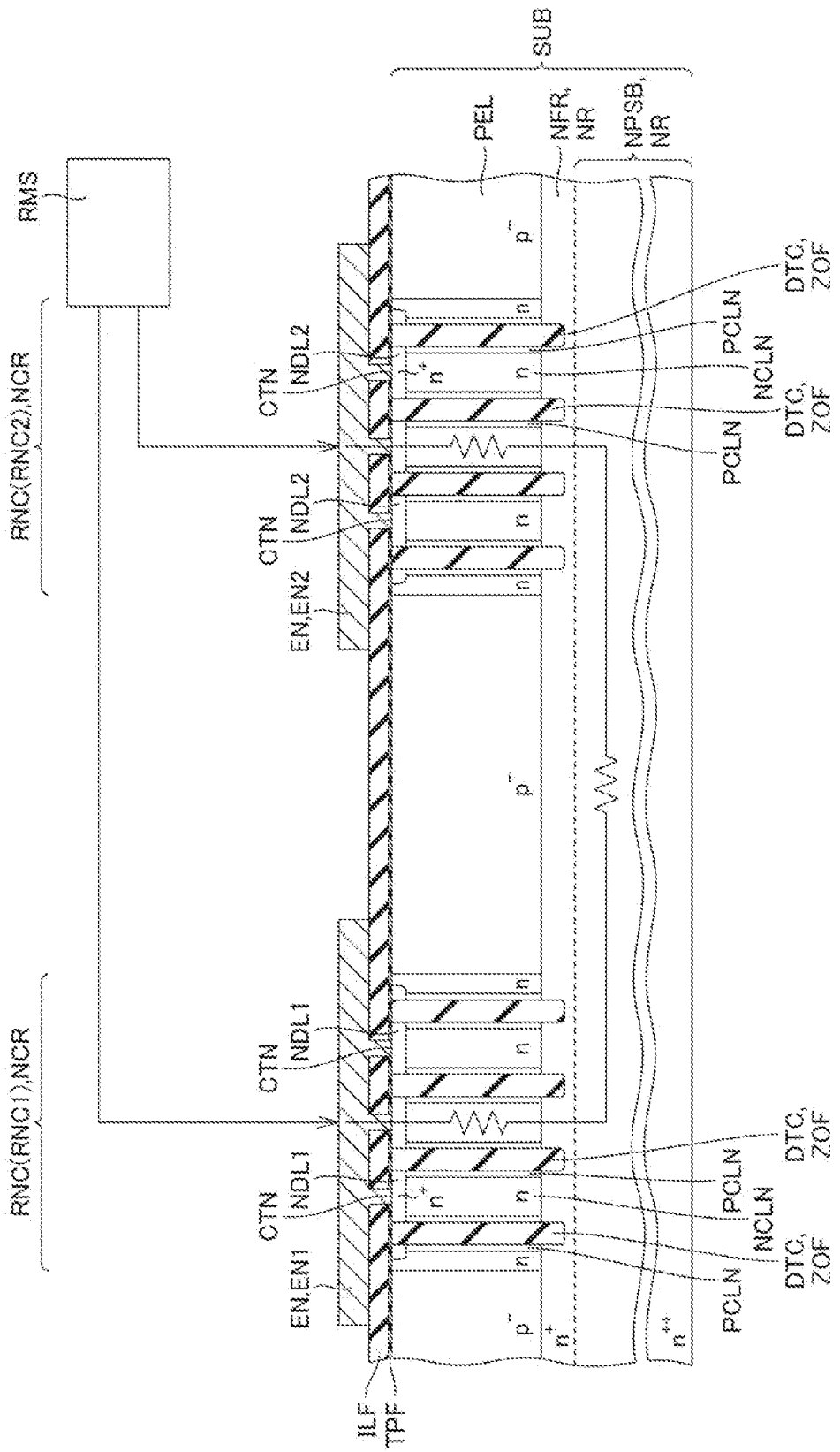
FIG. 17 is a cross-sectional view showing a step of measuring a resistance value of the n-type column resistor performed after the step shown in FIG. 16 according to the embodiment.

Next, for example, the resistance value of the n-type column resistor NCR formed in the n-type column region RNC is measured by the two-terminal method. As shown in FIG. 17, one terminal is brought into contact with the electrode EN1 and the other terminal is brought into contact with the electrode EN2. The resistance value between the electrodes EN1 and EN2 is measured by passing a predetermined current between one terminal and the other terminal from the resistance measuring instrument RMS. Namely, the resistance value at the time when a current flows through the n-type diffusion layer NDL1, the n-type column layer NCLN, the $n^{++}$-type substrate NPSB, the n-type column layer NCLN, and the n-type diffusion layer NDL2 is measured as the resistance value of the n-type column resistor NCR.

Figure 18:
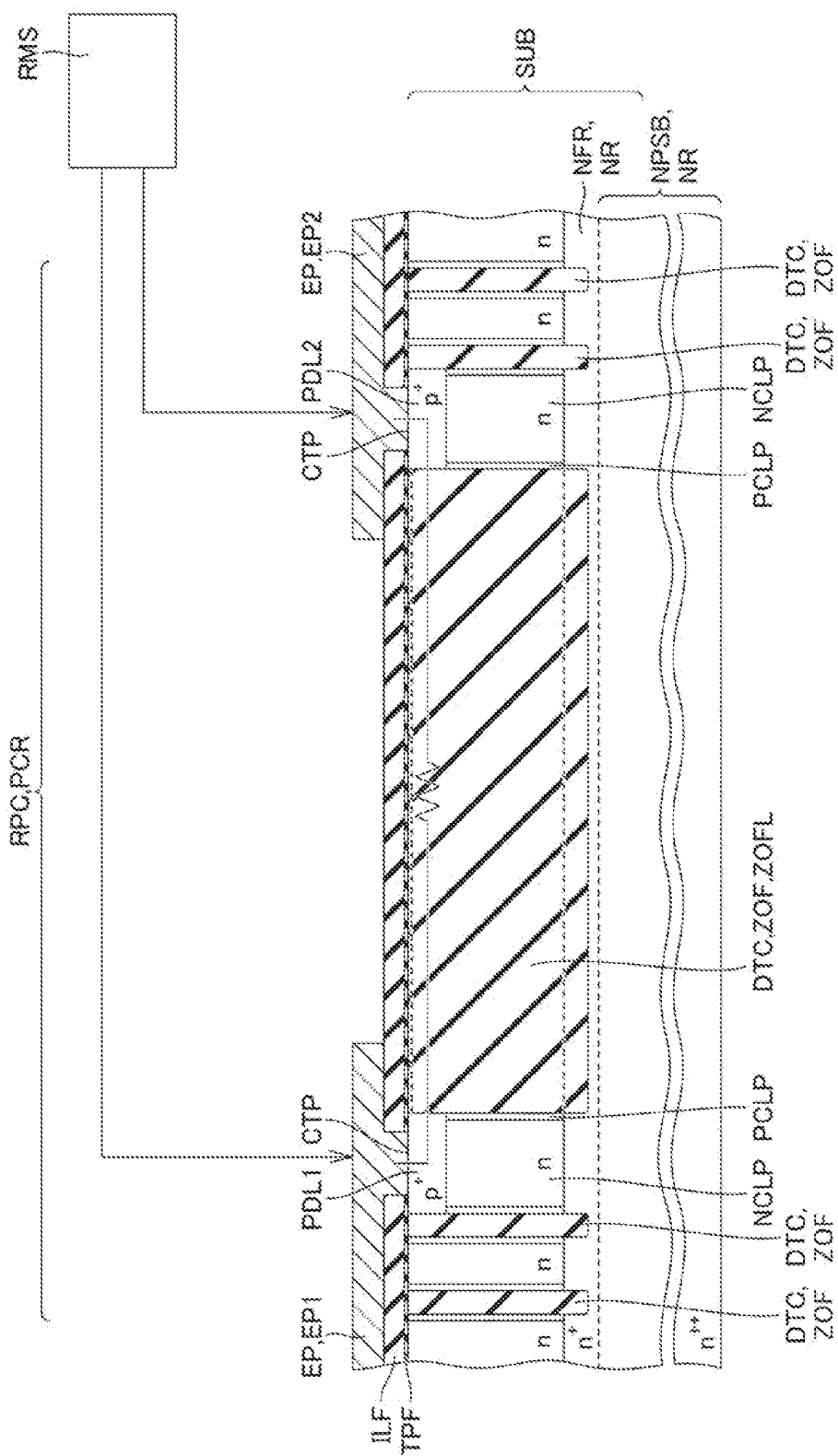
FIG. 18 is a cross-sectional view showing a step of measuring a resistance value of the p-type column resistor performed after the step shown in FIG. 16 according to the embodiment.

Next, for example, the resistance value of the p-type column resistor PCR formed in the p-type column region RPC is measured by the two-terminal method. As shown in FIG. 18, one terminal is brought into contact with the electrode EP1 and the other terminal is brought into contact with the electrode EP2. The resistance value between the electrodes EP1 and EP2 is measured by passing a predetermined current between one terminal and the other terminal from the resistance measuring instrument RMS. Namely, the resistance value at the time when a current flows through the p-type diffusion layer PDL1, the p-type column layer PCLN, and the p-type diffusion layer PDL2 is measured as the resistance value of the p-type column resistor PCR.

As will be described later, the ratio of the resistance value of the n-type column resistor NCR and the resistance value of the p-type column resistor PCR is measured from the measured resistance values of the n-type column resistor NCR and the p-type column resistor PCR, and the withstand voltage of the semiconductor element TRE is estimated.

Figure 19:
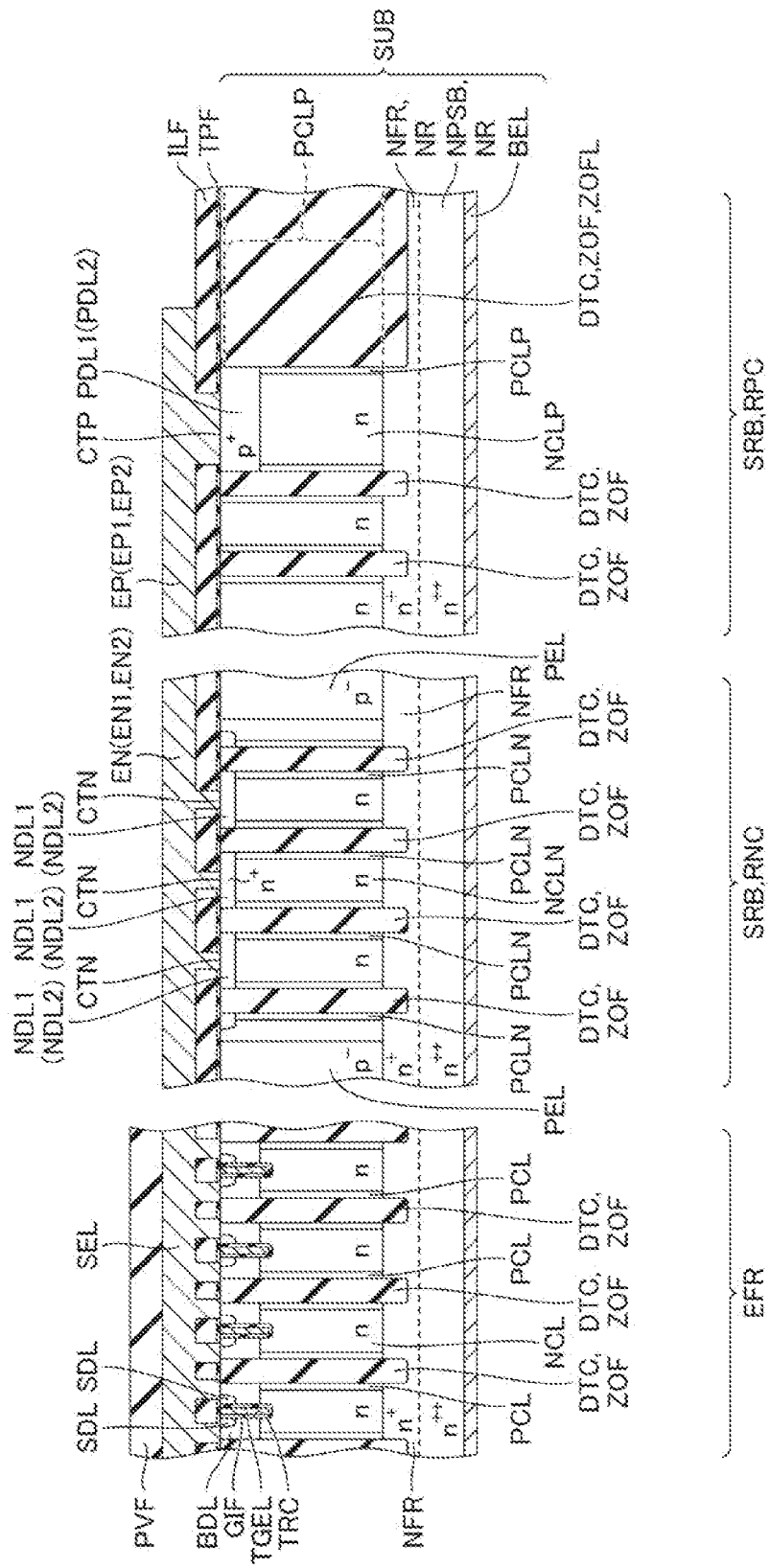
FIG. 19 is a partial cross-sectional view of the element region and the scribe region showing a step performed after the steps shown in FIG. 17 and FIG. 18 according to the embodiment.

Next, a gold film (not shown) is formed on the surface of the electrode pad (not shown) and others by, for example, plating. Next, the back surface of the semiconductor substrate SUB is polished. As shown in FIG. 19, the $n^{++}$-type substrate NPSB located on the back surface side of the semiconductor substrate SUB is polished until the thickness of the semiconductor substrate SUB reaches a desired thickness.

Next, the back surface electrode BEL is formed by, for example, the sputtering method on the back surface of the semiconductor substrate SUB that has been polished. Then, by dicing the semiconductor substrate SUB along the scribe region SRB, the element region EFR is taken out as a semiconductor chip. In this way, the main part of the semiconductor device PSD is completed.

In the above-mentioned semiconductor device, the withstand voltage of the semiconductor device PSD (semiconductor element TRE) can be estimated based on the ratio of the resistance value of the n-type column resistor NCR and the resistance value of the p-type column resistor PCR. This will be described in comparison with the semiconductor device according to a comparative example.

As described above, in the semiconductor device that is required to have a medium withstand voltage or higher (for example, 80 V or higher), the method of estimating the withstand voltage of the semiconductor device from the ratio of the dose amount of an n-type impurity for forming an n-type column layer and the dose amount of a p-type impurity for forming a p-type column layer cannot reflect variations of the impurities at the time of implantation. Therefore, there is a demand for a method that replaces the method of estimating the withstand voltage from the ratio of impurity dose amount.

As the method, the inventors first considered a method of actually measuring the withstand voltage of the completed semiconductor device (semiconductor element). However, in this method, it took time (days) from the completion of the wafer process to the formation of the back surface electrode, so that the detection of defective semiconductor devices was delayed. Therefore, the inventors considered another method of forming the TEG for measuring the withstand voltage in the scribe region.

Figure 20:
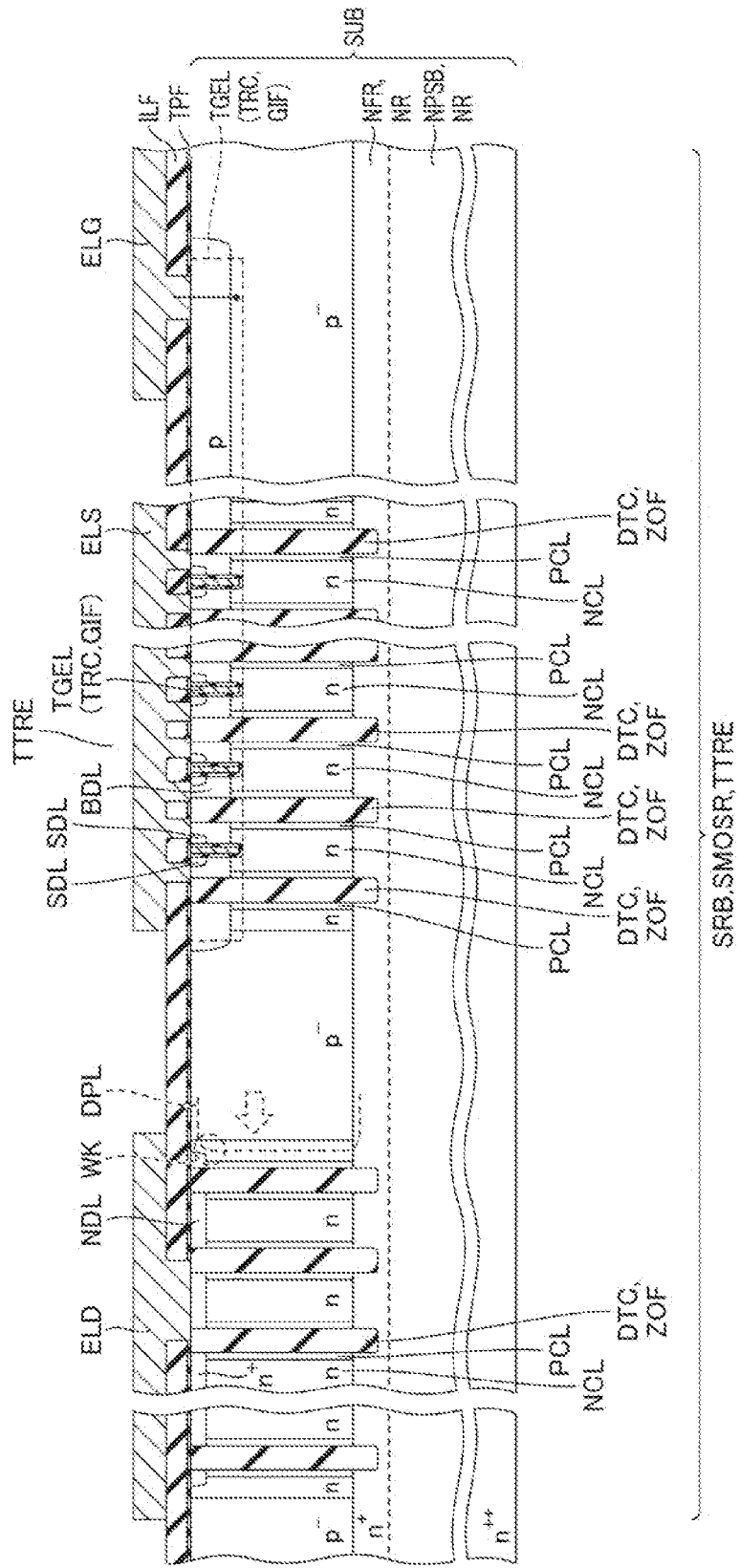
FIG. 20 is a cross-sectional view showing a vertical MOS transistor formed in a TEG region in a semiconductor device according to a comparative example.

FIG. 20 shows an example of the cross-sectional structure of a MOS transistor TTRE as a semiconductor element formed in a TEG region SMOSR defined in the scribe region SRB as the semiconductor device according to the comparative example. As shown in FIG. 20, in the TEG region SMOSR, an electrode ELG electrically connected to the gate electrode TGEL of the MOS transistor TTRE, an electrode ELS electrically connected to the source diffusion layer SDL, and an electrode ELD electrically connected to the $n^{++}$-type substrate NPSB (drain) are formed. Note that the members having the same structure as those in the semiconductor element TRE shown in FIG. 3 and others are denoted by the same reference characters, and the description thereof will not be repeated unless necessary.

In particular, the n-type diffusion layer NDL electrically connected to the electrode ELD is formed so as to surround the region where the MOS transistor TTRE is formed in a plan view. Therefore, the distance between the MOS transistor TTRE and the n-type diffusion layer NDL is restricted in the width direction of the scribe region SRB.

It was found that, due to such restrictions, among the depletion layers that spread when measuring the withstand voltage of the MOS transistor TTRE in the TEG region SMOSR, the end of the depletion layer DPL that was to spread in the width direction of the scribe region SRB came into contact with the n-type diffusion layer NDL (see dotted frame WK) in some cases. As a result, it was found that the MOS transistor TTRE broke down and the withstand voltage of the MOS transistor TTRE could not be measured accurately.

In contrast to the semiconductor device according to the comparative example, in the semiconductor device PSD according to the embodiment, the withstand voltage of the semiconductor element TRE is estimated based on the ratio of the resistance value of the n-type column resistor NCR and the resistance value of the p-type column resistor PCR.

The withstand voltage of the semiconductor device PSD (semiconductor element TRE) having a super junction structure depends on the charge balance between the charge amount Qp of the p-type column layer PCL and the charge amount Qn of the n-type column layer NCL that form the pn junctions arranged periodically. Namely, the withstand voltage of the semiconductor element TRE depends on the ratio of the charge amount Qp and the charge amount Qn (Qp/Qn).

Regarding this charge balance (Qp/Qn), the inventors paid attention to the fact that the reciprocal of the charge amount Qp corresponded to the resistance value of the p-type column layer PCL and the reciprocal of the charge amount Qn corresponded to the resistance value of the n-type column layer NCL. Based on this finding, the inventors found the method of estimating the withstand voltage of the semiconductor device PSD (semiconductor element TRE) formed in the element region EFR based on the ratio of the resistance value of the p-type column layer PCLP and the resistance value of the n-type column layer NCLN formed in the scribe region SRB.

Figure 21:
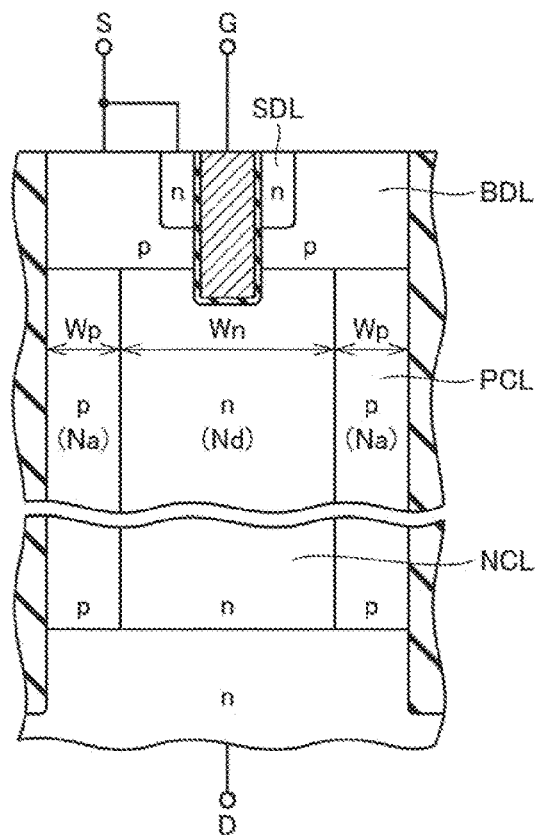
FIG. 21 is a partial cross-sectional view for describing a charge balance in a super junction structure according to the embodiment.

This will be described in detail. First, the charge balance will be described with reference to FIG. 21. The impurity concentration of the p-type column layer PCL is defined as Na, the impurity concentration of the n-type column layer NCL is defined as Nd, the width of the p-type column layer PCL is defined as Wp, the width of the n-type column layer NCL is defined as Wn, the charge amount of the p-type column layer PCL is defined as Qp, and the charge amount of the n-type column layer NCL is defined as Qn. Qp and Qn are expressed by the following equations.

$$Qp = Na \times Wp$$

$$Qn = Nd \times Wn$$

At this time, the condition for completely depleting the p-type column layer PCL and the n-type column layer NCL, that is, the state in which the charge balance is achieved is expressed by the following equation.

$$Qp = Qn$$

Further, when the resistance value of the n-type column layer NCL is defined as RRN and the resistance value of the p-type column layer PCL is defined as RRP, the following relational expressions can be obtained for Qn and Qp.

$$Qn = 1/RRN$$

$$Qp = 1/RRP$$

Then, in the element region, the following relational expression can be obtained for the charge balance.

$$Qp/Qn = RRN/RRP$$

On the other hand, the resistance value of the n-type column resistor NCR including the n-type column layer NCLN formed in the scribe region SRB is not the resistance value itself of the n-type column layer NCL formed in the element region EFR. However, since the n-type column layer NCLN is formed at the same time in the process of forming the n-type column layer NCL, the n-type column resistor NCR has the resistance value proportional to the resistance value of the n-type column layer NCL.

Further, the resistance value of the p-type column resistor PCR including the p-type column layer PCLP formed in the scribe region SRB is not the resistance value itself of the p-type column layer PCL formed in the element region EFR. However, since the p-type column layer PCLP is formed at the same time in the process of forming the p-type column layer PCL, the p-type column resistor PCR has the resistance value proportional to the resistance value of the p-type column layer PCL.

Accordingly, it can be said that, when the resistance value of the n-type column resistor NCR formed in the scribe region SRB is defined as RNJ and the resistance value of the p-type column resistor PRC formed in the scribe region SRB is defined as RPJ, the charge balance in the element region EFR has the following proportional relationship.

$$Qp/Qn \propto RNJ/RPJ$$

Figure 22:
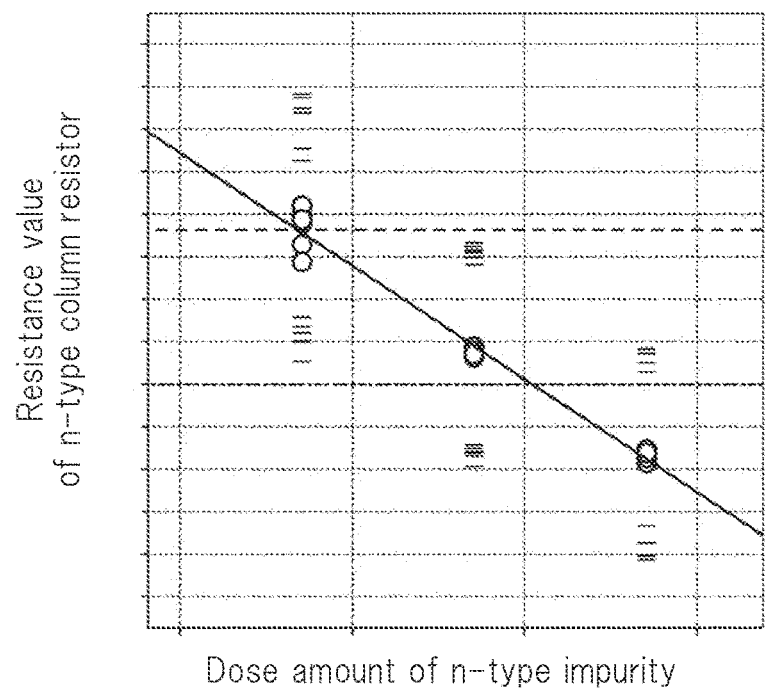
FIG. 22 is a graph showing an example of a relationship between the dose amount of an n-type impurity and a resistance value of the n-type column resistor according to the embodiment.
Figure 23:
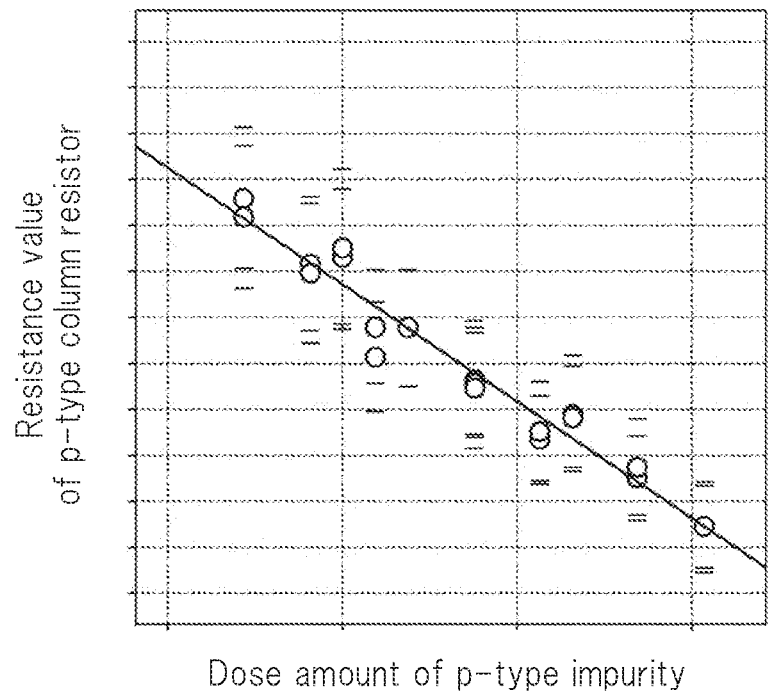
FIG. 23 is a graph showing an example of a relationship between the dose amount of a p-type impurity and a resistance value of the p-type column resistor according to the embodiment.

Next, the inventors evaluated the relationship between the resistance values of the n-type column resistor NCR and the p-type column resistor PCR and the dose amount. FIG. 22 shows the result of evaluating the relationship between the dose amount of the n-type impurity when forming the n-type column resistor NCR (n-type column layer NCL) and the resistance value of the n-type column resistor NCR. FIG. 23 shows the result of evaluating the relationship between the dose amount of the p-type impurity when forming the p-type column resistor PCR (p-type column layer PCL) and the resistance value of the p-type column resistor PCR.

The horizontal axis of the graph shown in FIG. 22 represents the dose amount of the n-type impurity, and the vertical axis represents the resistance value of the n-type column resistor NCR. The horizontal axis of the graph shown in FIG. 23 represents the dose amount of the p-type impurity, and the vertical axis represents the resistance value of the p-type column resistor PCR. In each of FIG. 22 and FIG. 23, circles indicate average values. The horizontal lines shown above and below each circle indicate error bars.

As shown in FIG. 22 and FIG. 23, it can be understood that the resistance value of the n-type column resistor NCR (p-type column resistor PCR) is proportional to the dose amount of the same n-type (p-type) impurity though there are some variations. It is conceivable that the variations in the resistance value are due to the variation in the wafer process such as the variation in the impurity distribution caused by the deep trench. In other words, it is conceivable that the variation in resistance value reflects the effective dose amount affected by the variation in the wafer process.

Figure 24:
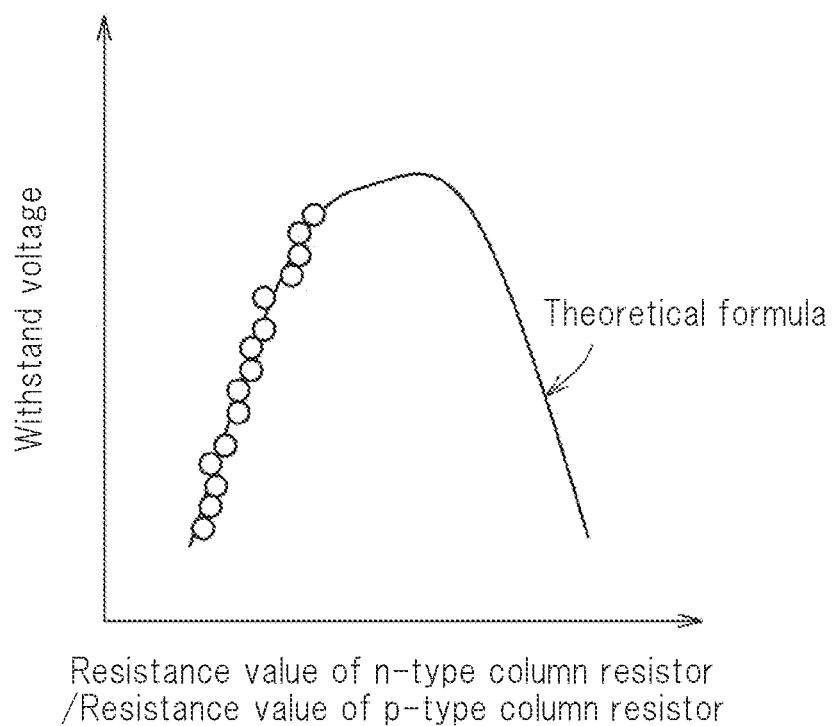
FIG. 24 is a graph showing an example of a relationship between a ratio of the resistance value of the n-type column resistor and the resistance value of the p-type column resistor and the withstand voltage according to the embodiment.

Next, the inventors evaluated the relationship between the ratio of resistance values and the withstand voltage of an actual semiconductor device. FIG. 24 shows the result. The horizontal axis of the graph shown in FIG. 24 represents the ratio of the resistance value of the n-type column resistor NCR and the resistance value of the p-type column resistor PCR. The resistance value of the n-type column resistor NCR is a resistance value of the n-type column resistor NCR formed in the scribe region measured by the two-terminal method. The resistance value of the p-type column resistor PCR is a resistance value of the p-type column resistor PCR formed in the scribe region measured by the two-terminal method. The vertical axis represents the withstand voltage (measured value) measured for the semiconductor element formed in the element region.

Further, FIG. 24 also shows a graph of the withstand voltage of the super junction structure theoretically derived from the ratio of the charge amount Qp of the p-type column layer PCL and the charge amount Qn of the n-type column layer NCL (Qp/Qn). As shown in FIG. 24, it can be understood that the withstand voltage of the semiconductor element with respect to the ratio of the resistance values (see the circles) is located along the graph of the withstand voltage of the super junction structure theoretically derived from the ratio of the charge amounts (Qp/Qn). This means that the withstand voltage of the semiconductor element TRE formed in the element region EFR can be estimated by the ratio of the resistance value of the n-type column resistor NCR formed in the scribe region SRB and the resistance value of the p-type column resistor PCR formed in the scribe region instead of the ratio of charge amounts (Qp/Qn).

Figures 25, 26:
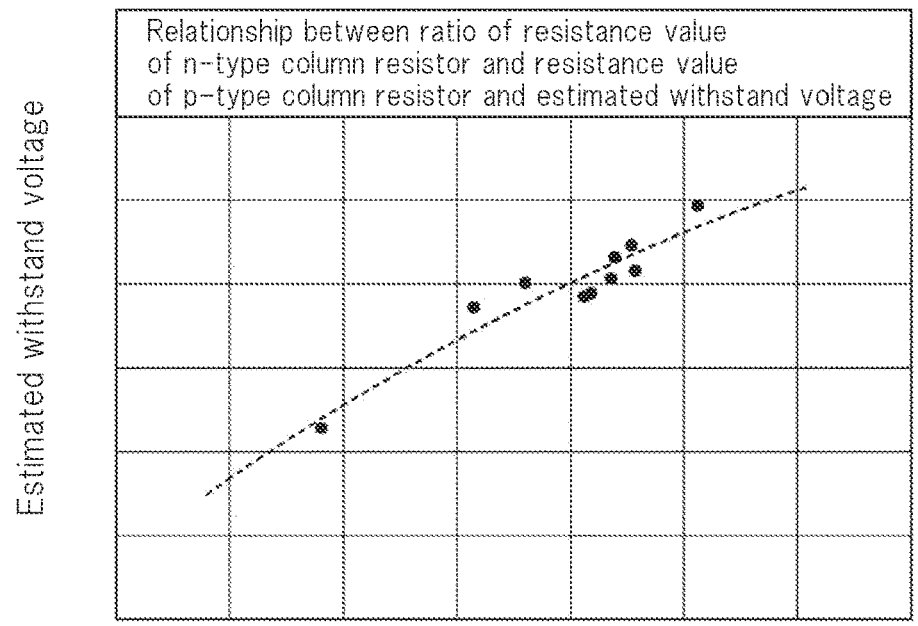
FIG. 25 is a graph showing an example of a relationship between the ratio of the resistance value of the n-type column resistor and the resistance value of the p-type column resistor and the estimated withstand voltage according to the embodiment.
FIG. 26 is a graph showing an example of a relationship between the estimated withstand voltage and the measured withstand voltage according to the embodiment.

In this way, the inventors found the method of estimating the withstand voltage of the semiconductor element TRE formed in the element region EFR by forming the n-type column resistor NCR and the p-type column resistor PCR in the scribe region SRB and calculating the ratio of the respective resistance values (RNJ/RPJ). FIG. 25 shows a graph showing the relationship between the ratio of resistance values (RNJ/RPJ) and the estimated withstand voltage obtained by the inventors. Based on this graph, the withstand voltage of the semiconductor element TRE can be estimated from the ratio of resistance values (RNJ/RPJ).

FIG. 26 shows a graph showing the relationship between the withstand voltage estimated from the ratio of resistance values (RNJ/RPJ) (estimated withstand voltage) and the withstand voltage measured for the actual semiconductor element TRE (measured value). It can be understood that the estimated withstand voltage estimated from the ratio of resistance values (RNJ/RPJ) is within the range of about ±2 to 3% of the measured withstand voltage (measured value), and it can be confirmed that they have a very high correlation.

By acquiring the relationship between the ratio of resistance values (RNJ/RPJ) and the estimated withstand voltage in advance, the withstand voltage of the semiconductor element TRE (semiconductor device PSD) can be estimated from the ratio of resistance values obtained at the time when the wafer process to the semiconductor substrate is completed. As a result, it is possible to detect the defective semiconductor elements that do not satisfy the desired withstand voltage at the time when the wafer process is completed, and the defective semiconductor elements can be eliminated at an early stage before performing the back surface polishing process or the like.

Further, by measuring the resistance values of the n-type column resistor NCR and the p-type column resistor PCR, the effective dose amount including the variations in impurity distribution and others in each of the n-type column layers NCL, NCLN, and NCLP and the p-type column layers PCL, PCLN, and PCLP can be confirmed.

Furthermore, the withstand voltage of the semiconductor element TRE can be estimated by measuring the resistance values of the n-type column resistor NCR and the p-type column resistor PCR, and it is not necessary to take into account the spread of the depletion layer as in the TEG region SMOSR. Accordingly, in the semiconductor substrate SUB, the occupied area of the n-type column region RNC and the p-type column region RPC can be made smaller than the occupied area of the TEG region SMOSR.

Furthermore, when measuring the resistance values of the n-type column resistor NCR and the p-type column resistor PCR, a general resistance measuring instrument can be used, and the increase in production cost can be suppressed.

Note that the semiconductor devices described in the embodiments can be combined in various ways as needed.

In the foregoing, the invention made by the inventors has been specifically described based on the embodiments, but it goes without saying that the present invention is not limited to the embodiments described above and can be variously modified within the range not departing from the gist thereof.

What is claimed is:

1. A semiconductor device comprising:
a semiconductor substrate having:
    a first main surface in which a first region, a second region and a third region are defined, and,
    a second main surface in which a first conductivity type region including a substrate of a first conductivity type is arranged;
a column structure formed in the semiconductor substrate, the column structure including a first column structure formed in the first region, a second column structure formed in the second region, and a third column structure formed in the third region; and
a back surface electrode formed on the second main surface of the semiconductor substrate,
wherein the column structure includes:
    a plurality of buried insulators formed in the semiconductor substrate, each of the plurality of buried insulators being formed from the first main surface toward the second main surface;
    a first impurity region of the first conductivity type formed in the semiconductor substrate and formed at least from a depth position, which is located at a distance from the first main surface, to the first conductivity type region; and
    a second impurity region of a second conductivity type formed in the semiconductor substrate and formed at least from the depth position to the first conductivity type region, the second impurity region being in contact with each of the respective buried insulator and the first impurity region,
wherein, in the first column structure:
    the plurality of buried insulators is formed in island shapes, respectively, at a distance from each other in a plan view;
    the first impurity region is formed from a position shallower than the depth position to the first conductivity type region; and
    a first resistor is formed of the first impurity region,
wherein, in the second column structure:
    each of the plurality of buried insulators is formed so as to extend in strip in a first direction in the plan view;
    the second impurity region is formed from the first main surface to the first conductivity type region and is in contact with the respective buried insulator extending in strip; and
    a second resistor is formed of the second impurity region located between a one end portion of the respective buried insulator and an another end portion of the respective buried insulator extending in strip, and
wherein, in the third column structure:
    a semiconductor element, through which a current is conducted between the first main surface and the second main surface, is formed in the semiconductor substrate.

2. The semiconductor device according to claim 1, wherein the first column structure includes:
    a first portion of the first column structure; and
    a second portion of the first column structure separated at a distance from the first portion of the first column structure, and
wherein the first impurity region in the first portion of the first column structure and the first impurity region in the second portion of the first column structure are electrically connected via the first conductivity type region in the semiconductor substrate.

3. The semiconductor device according to claim 1, wherein a scribe region and an element region partitioned by the scribe region are defined on the first main surface of the semiconductor substrate,
wherein the first region and the second region are arranged in the scribe region, and
wherein the third region is arranged in the element region.

4. The semiconductor device according to claim 3, wherein the first direction in which the buried insulator in the second column structure extends is a direction in which the scribe region extends.

* * * * *